(12) United States Patent
Liu et al.

(10) Patent No.: US 11,104,570 B2
(45) Date of Patent: *Aug. 31, 2021

(54) SHOCK CAGING FEATURES FOR MEMS ACTUATOR STRUCTURES

(71) Applicant: MEMS Drive (Nanjing) Co., Ltd., Jiangsu (CN)

(72) Inventors: Xiaolei Liu, South Pasadena, CA (US); Matthew Ng, Rosemead, CA (US); Robert Calvet, Pasadena, CA (US); Gerardo Morabito, Arcadia, CA (US)

(73) Assignee: MEMS Drive (Nanjing) Co., Ltd., Jiangsu (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/385,486

(22) Filed: Apr. 16, 2019

(65) Prior Publication Data
US 2019/0308871 A1    Oct. 10, 2019

Related U.S. Application Data

(63) Continuation of application No. 15/412,488, filed on Jan. 23, 2017, now Pat. No. 10,259,702, which is a continuation of application No. 15/165,893, filed on May 26, 2016, now Pat. No. 10,322,925.

(51) Int. Cl.
| | |
|---|---|
| *H02B 1/00* | (2006.01) |
| *B81B 3/00* | (2006.01) |
| *B81B 7/00* | (2006.01) |
| *H02N 1/00* | (2006.01) |

(52) U.S. Cl.
CPC .......... *B81B 3/0021* (2013.01); *B81B 3/0051* (2013.01); *B81B 7/0016* (2013.01); *B81B 7/0058* (2013.01); *H02N 1/008* (2013.01); *B81B 2201/033* (2013.01); *B81B 2203/0118* (2013.01); *B81B 2203/0136* (2013.01)

(58) Field of Classification Search
CPC ... B81B 3/0021; B81B 3/0051; B81B 7/0016; B81B 7/0058; B81B 2201/033; B81B 2203/0136; B81B 2203/0118; H02N 1/008
USPC ........................................................ 310/309
See application file for complete search history.

(56) References Cited

U.S. PATENT DOCUMENTS

| | | |
|---|---|---|
| 6,065,341 A | 5/2000 | Ishio et al. |
| 6,360,605 B1 | 3/2002 | Pinter et al. |
| 6,388,359 B1 | 5/2002 | Duelli et al. |

(Continued)

OTHER PUBLICATIONS

International Search Report issued in International Application No. PCT/US2016/067921 dated Mar. 2, 2017.

(Continued)

*Primary Examiner* — John K Kim
(74) *Attorney, Agent, or Firm* — Brian J. Colandreo; Michael T. Abramson; Holland & Knight LLP

(57) ABSTRACT

Caging structures are disclosed for caging or otherwise reducing the mechanical shock pulse experienced by MEMS device beam structures during events that may cause mechanical shock to the MEMS device. The caging structures at least partially surround the beam such that they limit the motion of the beam in a direction perpendicular to the beam's longitudinal axis, thereby reducing stress on the beam during a mechanical shock event. The caging structures may be used in combination with mechanical shock-resistant beams.

15 Claims, 20 Drawing Sheets

(56) References Cited

U.S. PATENT DOCUMENTS

| | | |
|---|---|---|
| 6,736,521 B1 | 5/2004 | Turner |
| 7,019,231 B2 | 3/2006 | Ishikawa et al. |
| 7,905,146 B2 | 3/2011 | Suzuki |
| 8,674,460 B2 | 3/2014 | Gutierrez et al. |
| 9,446,937 B2 | 9/2016 | Akiba et al. |
| 9,621,775 B2 | 4/2017 | Ng et al. |
| 9,769,385 B2 | 9/2017 | Ng et al. |
| 9,770,771 B2 * | 9/2017 | Barrot .................. B81C 99/008 |
| 10,259,702 B2 * | 4/2019 | Liu ....................... B81B 7/0058 |
| 10,322,925 B2 * | 6/2019 | Liu ....................... B60P 3/2205 |
| 2009/0025478 A1 | 1/2009 | Miki |
| 2009/0180167 A1 | 7/2009 | Tani et al. |
| 2011/0188104 A1 | 8/2011 | Tachibana et al. |
| 2012/0081598 A1 | 4/2012 | Calvet et al. |
| 2012/0120470 A1 | 5/2012 | Kitazawa et al. |
| 2012/0140303 A1 | 6/2012 | Marxer et al. |
| 2013/0019678 A1 | 1/2013 | Lazaroff et al. |
| 2013/0077945 A1 | 3/2013 | Liu et al. |
| 2013/0215525 A1 | 8/2013 | Wang et al. |
| 2013/0264755 A1 | 10/2013 | Eskridge |
| 2014/0363217 A1 | 12/2014 | Barrot et al. |
| 2015/0321900 A1 | 11/2015 | Liu et al. |
| 2015/0334277 A1 | 11/2015 | Liu et al. |
| 2017/0023606 A1 | 1/2017 | Naumann |
| 2017/0082519 A1 | 3/2017 | Blomqvist et al. |
| 2017/0190568 A1 | 7/2017 | Morabito et al. |
| 2017/0190569 A1 * | 7/2017 | Liu ........................ H02N 1/006 |
| 2017/0341928 A1 * | 11/2017 | Liu ....................... B81B 7/0016 |
| 2017/0373611 A1 | 12/2017 | Cottone et al. |
| 2019/0308871 A1 * | 10/2019 | Liu ....................... B81B 3/0051 |

OTHER PUBLICATIONS

Non-Final Office Action issued in Application No. 15/165,893 dated Jun. 26, 2018.

Non-Final Office Action issued in Application No. 15/412,488 dated Jul. 20, 2017.

Non-Final Office Action issued in Application No. 15/412,488 dated Nov. 9, 2017.

International Search Report issued in International Application No. PCT/US2016/060547 dated Mar. 10, 2017.

Final Office Action issued in U.S. Appl. No. 15/412,488 dated Mar. 19, 2018.

Non-Final Office Action issued in U.S. Appl. No. 15/412,488 dated Aug. 3, 2018.

* cited by examiner

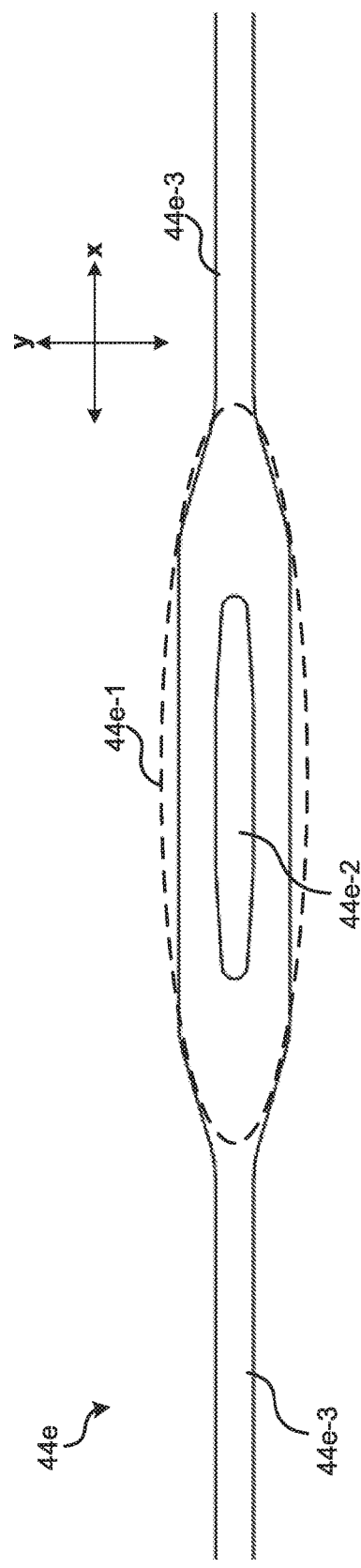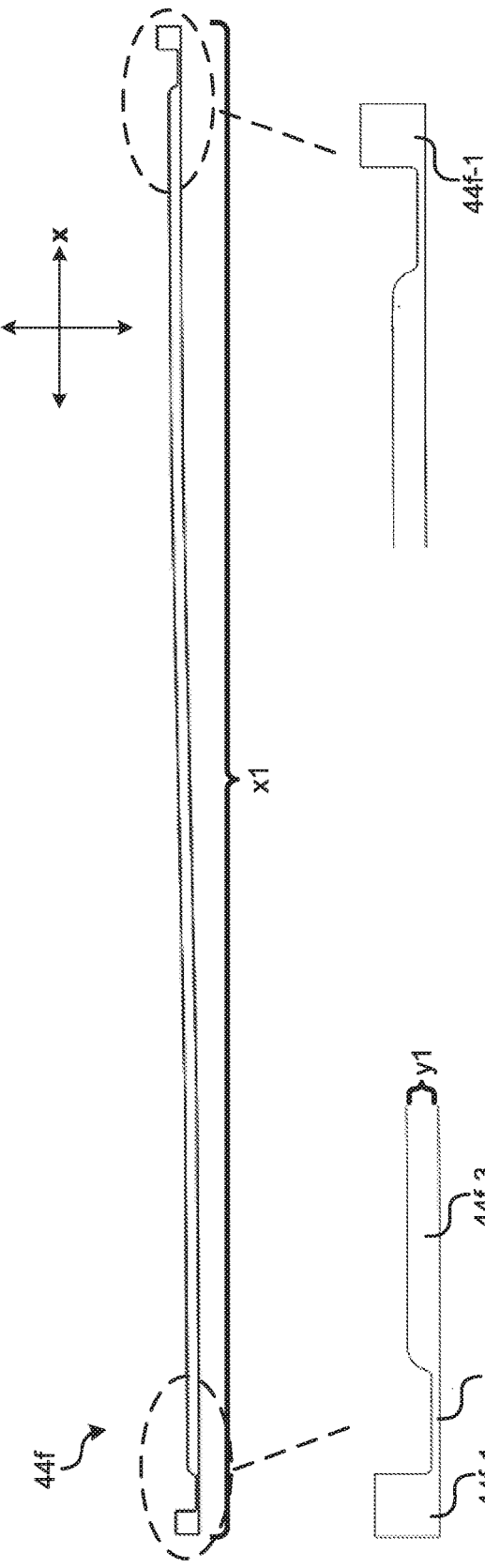

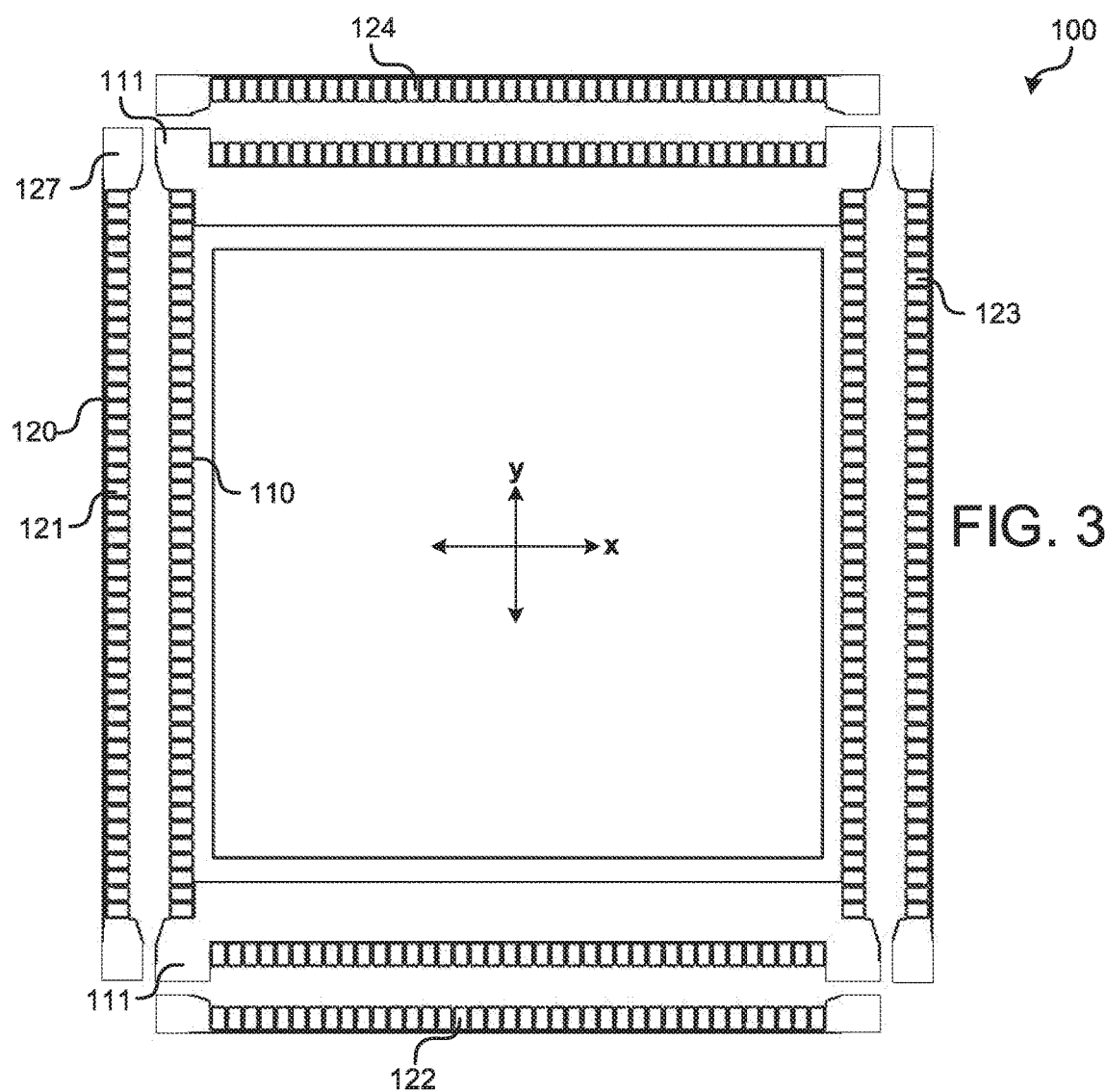
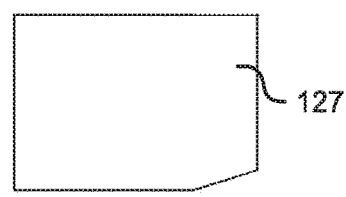
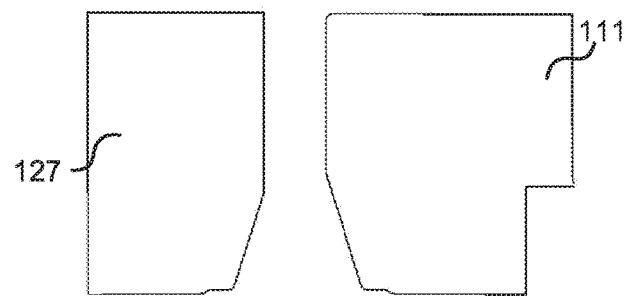
FIG. 3A
FIG. 3B

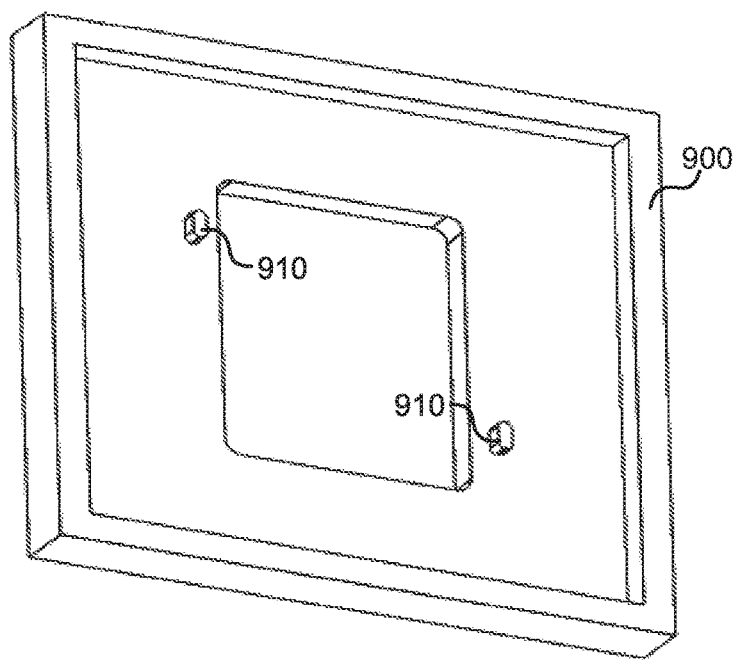
FIG. 6B
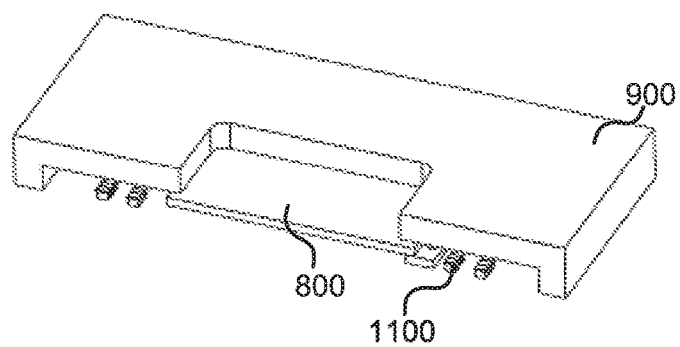
FIG. 6C
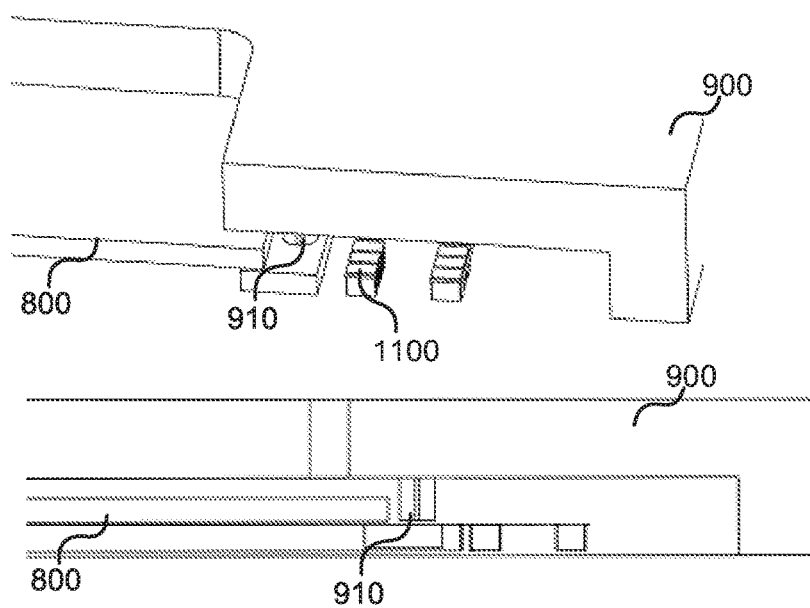
FIG. 6D
FIG. 6E

SHOCK CAGING FEATURES FOR MEMS ACTUATOR STRUCTURES

CROSS-REFERENCE TO RELATED APPLICATION

This application is a continuation of U.S. patent application Ser. No. 15/412,488, filed on Jan. 23, 2017, entitled "Shock Caging Features for MEMS Actuator Structures, which is a continuation of U.S. patent application Ser. No. 15/165,893 filed on 26 May 2016, entitled "Shock Caging Features For MEMS Actuator Structures", the contents of which are all incorporated herein by reference.

TECHNICAL FIELD

The present disclosure relates generally to mechanical shock resistant structures for microelectromechanical systems (MEMS), and more particularly, embodiments relate to shock caging features for MEMS actuator structures.

BRIEF SUMMARY OF THE DISCLOSURE

In accordance with various embodiments of the technology disclosed herein, structures are disclosed for caging or otherwise reducing the shock pulse experienced by MEMS device beam structures during events that may cause mechanical shock to the MEMS device. In one embodiment, a MEMS device includes a beam and a silicon caging structure that at least partially surrounds the beam. The beam has a center portion including a first end and second end, a first hinge directly coupled to the first end of the center portion, and a second hinge directly coupled to the second end of the center portion, where the first hinge and second hinge are thinner than the center portion. The silicon caging structure limits a maximum displacement of the beam in a direction perpendicular to its length. In embodiments, the beam is rigid in a direction along its length and flexible in a direction perpendicular to its length, and the beam may be between 1 and 7 millimeters long and between 10 and 70 micrometers wide.

In one embodiment, the beam is a conductive cantilever, and the center portion is curved and includes a point of inflection. In another embodiment, the beam is a motion control flexure, and the center portion is tapered along its length such that it is widest at its center and narrowest at its ends.

In one embodiment, the MEMS device includes a moving frame, and the silicon caging structure is part of the moving frame. In implementations of this embodiment, at least one of the first hinge and the second hinge is coupled to the moving frame. In further implementations of this embodiment, the silicon caging structure may include: a protrusion extending parallel to and along the length of the first hinge or the second hinge, where the protrusion limits the maximum displacement of the beam in a direction perpendicular to its length.

In another embodiment, the MEMS device is an actuator, the beam is a motion control flexure of the actuator, and at least one of the first hinge and the second hinge is coupled to a frame of the actuator. In implementations of this embodiment, the first hinge is coupled to a fixed frame of the actuator, and the second hinge is coupled to a moving frame of the actuator.

In a further embodiment, each of the first and second hinges of the beam is coupled to the center portion by a respective forked junction in a direction perpendicular to the length of the cantilever, and the respective forked junction includes a plurality of parallel beams. In an implementation of this embodiment, the silicon caging structure includes: a protrusion extending parallel to and along the length of the first hinge or the second hinge, where the protrusion limits the maximum displacement of the cantilever in a direction perpendicular to its length, and where the cantilever reaches its maximum perpendicular displacement when the protrusion contacts one of the forked junctions.

In yet another embodiment of the technology disclosed herein, a MEMS actuator includes: a plurality of silicon beams; and a silicon caging structure at least partially surrounding each of the plurality of silicon beams, where the silicon caging structure limits a maximum displacement of each of the plurality of silicon beams in a direction perpendicular to the silicon beam's length. In implementations of this embodiment, the MEMS actuator includes a moving frame, the moving frame includes at least a portion of the silicon caging structure, and one or more of the plurality of silicon beams is directly coupled to the moving frame.

As used herein, the term "about" in quantitative terms refers to plus or minus 10%. For example, "about 10" would encompass 9-11. Moreover, where "about" is used herein in conjunction with a quantitative term it is understood that in addition to the value plus or minus 10%, the exact value of the quantitative term is also contemplated and described. For example, the term "about 10" expressly contemplates, describes and includes exactly 10.

Other features and aspects of the disclosure will become apparent from the following detailed description, taken in conjunction with the accompanying drawings, which illustrate, by way of example, the features in accordance with various embodiments. The summary is not intended to limit the scope of the invention, which is defined solely by the claims attached hereto.

BRIEF DESCRIPTION OF THE DRAWINGS

The disclosed technology, in accordance with one or more various embodiments, is described in detail with reference to the following figures. The drawings are provided for purposes of illustration only and merely depict typical or example embodiments of the disclosed technology. These drawings are provided to facilitate the reader's understanding of the disclosed technology and shall not be considered limiting of the breadth, scope, or applicability thereof. It should be noted that for clarity and ease of illustration these drawings are not necessarily made to scale.

FIG. 2C illustrates a cantilever having a forked junction design that may be implemented in embodiments of the disclosed technology.

FIG. 2D illustrates a cantilever having an S-shaped design that may be implemented in embodiments of the disclosed technology.

FIG. 3A illustrates an example MEMS actuator including an outer frame, inner frame, and shock stops in accordance with the disclosed technology.

FIG. 3B is a magnified view of the shock stops of the MEMS actuator of FIG. 3A.

FIG. 6B illustrates a package housing for covering the image sensor of FIG. 6A, the packaging housing including shock stops for reducing the gap between the package housing and the moving frame, in accordance with an embodiment of the present disclosure.

FIG. 6C illustrates a cross-section of an assembled actuator optoelectronic package, in accordance with an embodiment of the present disclosure.

FIG. 6D illustrates a cross-section of an assembled actuator optoelectronic package, in accordance with an embodiment of the present disclosure.

FIG. 6E illustrates a cross-section of an assembled actuator optoelectronic package, in accordance with an embodiment of the present disclosure.

The figures are not intended to be exhaustive or to limit the invention to the precise form disclosed. It should be understood that the invention can be practiced with modification and alteration, and that the disclosed technology be limited only by the claims and the equivalents thereof.

DETAILED DESCRIPTION

In accordance with various embodiments of the disclosed technology, structures are disclosed for caging or otherwise reducing the mechanical shock pulse experienced by MEMS device beam structures during events that may cause mechanical shock to the MEMS device. The caging structures described herein may at least partially surround cantilevers, flexures, or other beam structures. This limits the motion of the beam in a direction perpendicular to the beam's longitudinal axis, thereby reducing stress on the beam and preventing possible breakage or damage in the event of a mechanical shock.

For example, in the event that a device (e.g., a cellphone) with an installed MEMS device is dropped from a height that may produce a significant shock force (e.g., greater than one meter), the caging structures disclosed herein may prevent damage to the beam structures of the MEMS actuator when the device hits the ground. By preventing the beams from experiencing large amplitude oscillations perpendicular to their length or otherwise moving excessively during the impact of the drop, the caging structures help reduce stress on the beam.

In embodiments, the disclosed shock caging structures may be used in combination with shock-resistant MEMS device structures (e.g., shock resistant beam structures). In implementations, the shock-resistant structures may reduce load on the MEMS actuator and resist deformation during events that may cause shock to the MEMS actuator. Accordingly, by implementing a combination of shock caging features with shock-resistant structures, the reliability of a MEMS device may be improved.

FIGS. 1-7 illustrate MEMS actuators for moving an optoelectronic device that may implement shock resistant structures in accordance with particular embodiments of the technology disclosed herein. It should be noted that although the resistant caging MEMS structures will be described primarily with reference to the example MEMS actuators of FIGS. 1-7, one having skill in the art would appreciate that the shock resistant structures described herein could be implemented in other MEMS apparatuses including moving beams that may be subject to mechanical shock events.

Figure 1A:
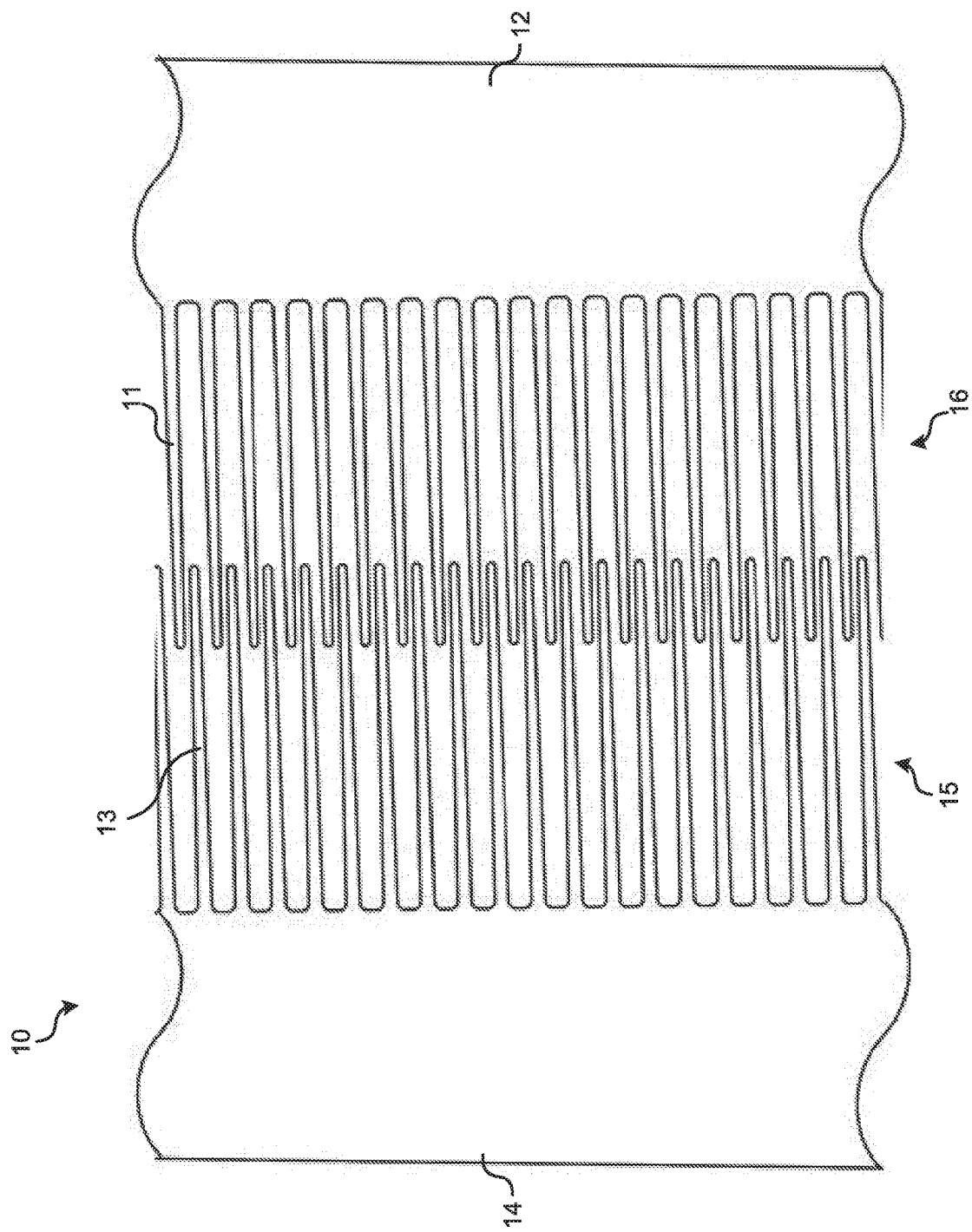
FIG. 1A illustrates a plan view of a comb drive in accordance with example embodiments of the disclosed technology.
Figure 1B:
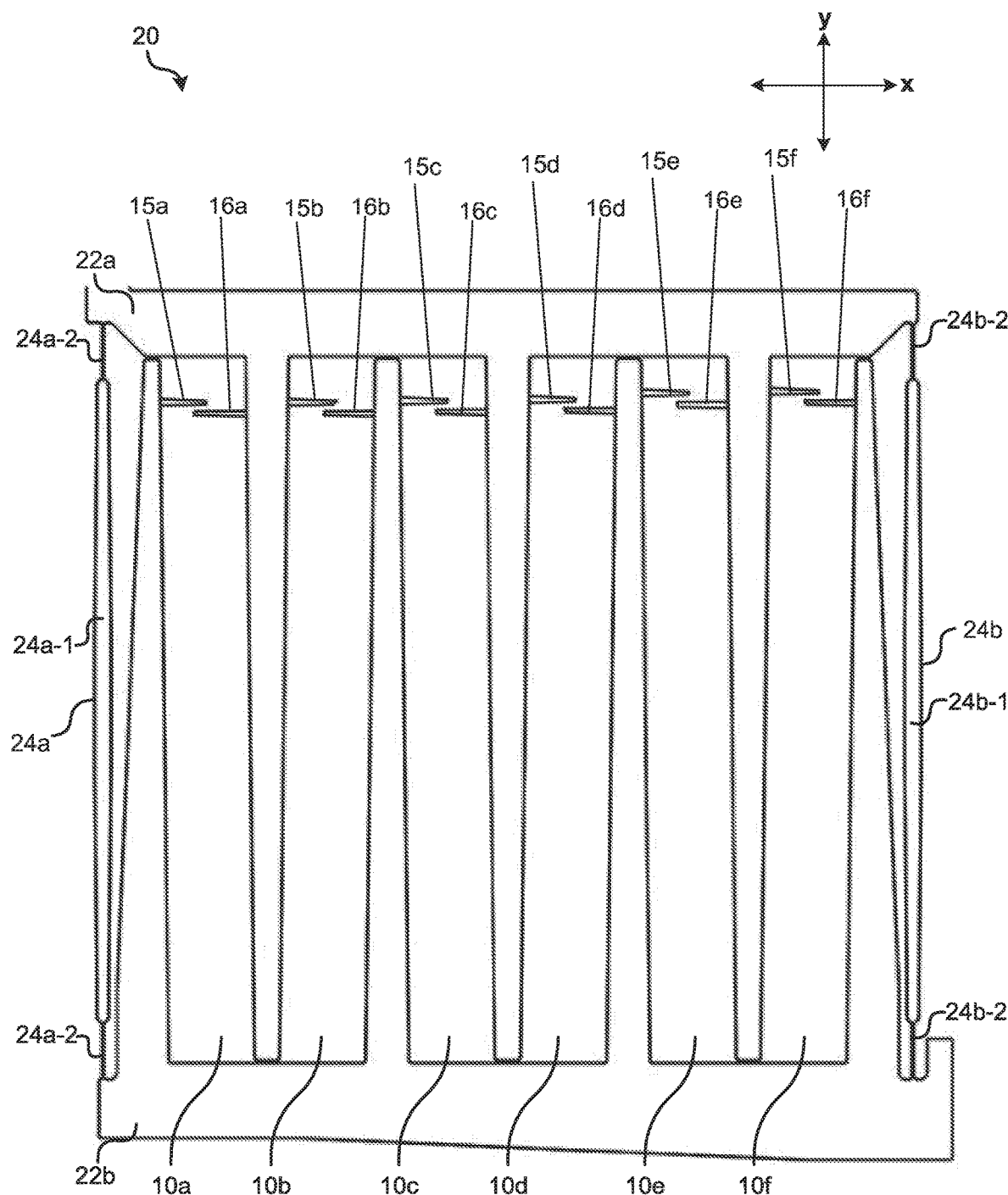
FIG. 1B illustrates a plan view of a bidirectional comb drive actuator including six of the comb drives of FIG. 1A that may use shock-resistant motion control flexures in accordance with embodiments of the disclosed technology.

FIGS. 1A-1B illustrate plan views of a comb drive 10 and bidirectional comb drive actuator 20 including six comb drives 10a-f in accordance with example embodiments of the present disclosure. As illustrated in FIG. 1A, each comb drive 10 includes comb finger arrays 15 and 16. Each comb finger array 15 and 16 includes a respective spine (14, 12) and plurality of comb fingers (13, 11).

Figure 1C:
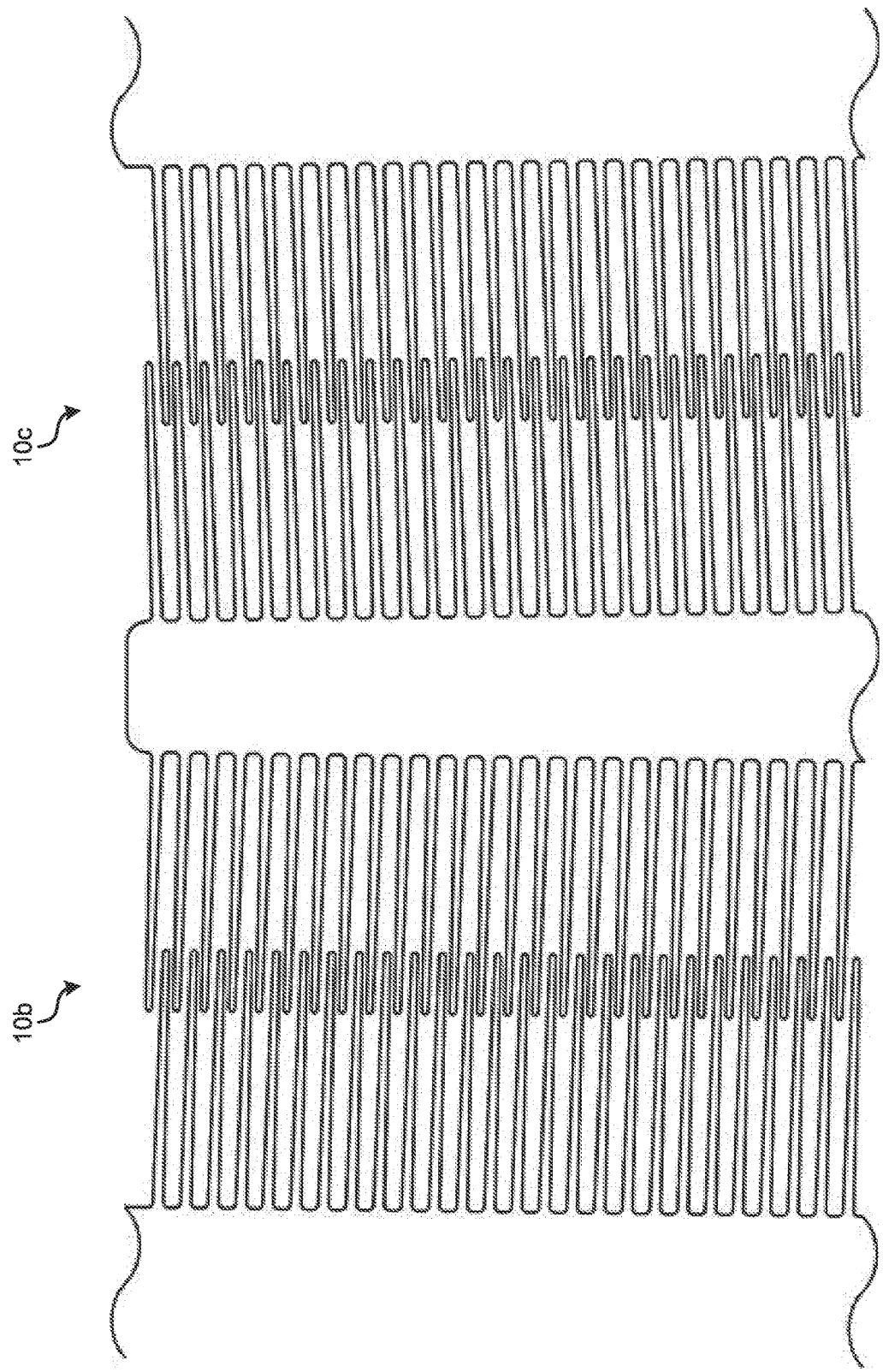
FIG. 1C is a magnified view of a first comb drive coupled to a second comb drive in accordance with embodiments of the disclosed technology.

Bidirectional Comb drive actuator 20 includes first and second frame pieces 22a-22b, and first and second motion control flexures 24a-24b. Although not shown in detail in FIG. 1B, it will be understood that, as shown in FIG. 1A, for each comb drive 10a-f, comb fingers 11 and 13 extend substantially from left to right, and vice versa, in comb finger arrays 15a-f and 16a-f. Moreover, it will be understood that spines 12 and 14 run substantially vertically from first frame piece 22a to second frame piece 22b, i.e., substantially in parallel with motion control flexures 24a-24b. This is illustrated by FIG. 1C, which shows a first comb drive 10b coupled to a second comb drive 10c.

As illustrated in this embodiment, spine 14 is attached to second frame piece 22b, while spine 12 is attached to first frame piece 22a. During operation, as comb finger arrays 15 and 16 of each comb drive 10a-10f are attracted to or repelled from one another by electrostatic forces, movement occurs such that first frame piece 22a likewise moves in a direction when the second frame is fixed (e.g., in the positive X direction in FIG. 1B). One of skill in the art will appreciate, upon studying the present disclosure, that electrostatic forces and other motive forces may be developed between each pair of comb finger arrays 15 and 16 by methods other than applying voltage, without departing from the spirit of the present disclosure. For example, charge may be applied to comb finger arrays 15 and 16.

In various embodiments, spines 12 and 14 and first and second frame pieces 22a and 22b may be dimensioned wide and deep enough to be rigid and not flex substantially under an applied range of electrostatic or other motive forces. For example, in particular embodiments spines 12 and 14 may be about 20 to 100 micrometers wide and about 50 to 250 micrometers deep, and first and second frame pieces 22a and 22b may be larger than about 50 micrometers wide and about 50 to 250 micrometers deep.

In one embodiment, during operation of comb drive actuator 20, when comb finger arrays 15a and 16a are electrified (e.g., in the manner described above), a motive force is applied with respect to first and second frame pieces 22a-22b such that either first or second frame piece 22a-22b moves substantially horizontally from an initial position with respect to second or first frame piece 22a-22b, depending upon which of first and second frame piece 22a-22b is mechanically fixed. Once comb finger arrays 15a and 16a are no longer electrified, first or second frame pieces 22a-22b move back to the initial state due to the spring restoring force of first and second motion flexures 24a and 24b. Further to this implementation, movement in a substantially opposite direction is achieved (e.g., in the opposite X direction in FIG. 1B), in addition to the movement resulting from comb drive 10a, when comb finger arrays 15c and 16c of comb drive 10c are electrified. Likewise, bidirectional movement in these two directions (i.e., positive and negative X direction in the drawing) may be achieved by electrifying the comb finger arrays of comb drives 10b, 10d, and 10e-f.

In various embodiments, spines 12 and 14 of comb finger arrays 15a-f and 16a-f may be attached to first and/or second frame pieces 22a-b in different configurations to achieve different purposes. For example, in one embodiment, for each comb drive 10a-10f, spine 12 is attached to first frame piece 22a while spine 14 is attached to second frame piece 22b. Such a configuration results in a parallel cascade of comb drives 10a-f that may increase the electrostatic force ultimately applied to first and second frame pieces 22a-b. In another example embodiment, comb drives 10a-10f are arranged in a back-to-back fashion to achieve bidirectional movement, as described above. While this back-to-back arrangement was described above with regard comb drives 10a-f—i.e., six comb drives 10—a different number of comb drives may be used to achieve bidirectional movement.

In one embodiment, a comb finger array, for example, 16a, 16c, 16e or 15b, 15d, 15f of each comb drive 10a-10f may be tied to a common potential (e.g., ground or some other positive or negative voltage) that acts as a reference for the other three comb finger arrays. Given this reference, the comb finger arrays that are not tied to a common potential may be electrified depending upon the direction of movement required.

For example, consider an embodiment where comb finger arrays 15a, 16b, 15c, 16d, 15e and 15f of comb drives 10a-10f are tied to a common ground. In this embodiment, movement of comb drive actuator 20 may be effectuated by applying a positive or negative voltage (e.g., relative to ground or other common reference) to comb finger array 16a, hence causing comb finger array 16a to be attracted to comb finger array 15a. Assuming second frame piece 22b is fixed, this attraction would, in this example, cause first frame piece 22a to move to the left in FIG. 1B. Further to this illustration, electrifying comb finger array 15b may entail applying thereto a positive or negative voltage 15b, hence causing comb finger array 15b to be attracted to comb finger array 16b. This attraction would, in this instance, cause first frame piece 22a to move to the right in FIG. 1B, assuming again that second frame piece 22b is fixed.

In further embodiments, the motive force developed by a comb drive 10a may differ from the motive force developed by another comb drive 10b-10f. For example, voltages of different magnitudes may be applied to some or all of comb finger arrays 15b, 15d, and 15f, or whichever comb finger arrays are not tied to a common potential. In some embodiments, for comb finger arrays 15b, 15d, and 15f to maintain different voltage levels, or electrostatic or charge states, the comb finger arrays may be electrically separate (or isolated) from one another.

The movement of first or second frame pieces 22a-22b and comb finger arrays 15a-f or 16a-f of each comb drive 10a-10f may be directed and/or controlled to some extent by first and second motion control flexures 24a-24b. In this particular embodiment, for example, first and second motion control flexures 24a-24b are substantially flexible or soft in the horizontal direction (i.e., in the direction of comb fingers 11 and 13) and substantially stiff or rigid in the vertical direction (i.e., in the direction of spines 12 and 14). Accordingly, first and second motion control flexures 24a-24b allow comb drive 10 to effect bidirectional movement horizontally (i.e., in the X direction FIG. 1B) while substantially restricting the movement in the vertical direction (i.e., in the Y direction in FIG. 1B).

The arrangement of first and second motion control flexures 24a-24b may be referred to, in some embodiments, as a double parallel flexure motion control. Such a double parallel flexure motion control may produce nearly linear motion, but there may be a slight run-out known as arcuate motion. Nevertheless, the gap on one side of comb fingers 11 may not be equal to the gap on the other side of comb fingers 11, and this may be used advantageously in design to correct for effects such as arcuate motion of a double parallel flexure motion control. In embodiments, additional structures may be used to control the motion of first and second frame pieces 22a-22b with respect to one another.

In the illustrated embodiment, first and second flexures 24a-24b include thinner portions 24a-2 and 24b-2 on the respective ends thereof. These thinner portions may allow bending when, for example, there is a translation of first frame piece 22a with respect to second frame piece 22b or vice versa (i.e., in the X direction in FIG. 1B). In embodiments, the thicker portion 24a-1 and 24b-1 of first and second flexures 24a and 24b may be dimensioned to be about 10 to 50 micrometers (µm) wide (i.e., width in x direction of FIG. 1B), and the thinner portions 24a-2 and 24b-2 may be dimensioned to be about 1 to 10 µm wide. In various embodiments, any number and type of motion controls may be used as desired to control or limit the motion of comb finger arrays 15 or 16. Controlled motion may enhance the overall precision with which comb drive actuator 20 effects movement, or positions a device such as, for example, an image sensor in a smartphone camera. In addition, controlled motion aids in avoiding a situation in which comb fingers 11 and 13 snap together. For example, controlled motion may generally be effected by creating a lower level of stiffness in desired direction of motion of comb fingers 15 and 16, while creating a higher level of stiffness in all undesired degrees of freedom, especially in the direction orthogonal to the motion of comb fingers 15 and 16 in the plane of comb drive actuator 20. By way of example, this may be done using a double parallel flexure type motion control.

In various embodiments, motion control flexures 24a and 24b may be designed to improve the shock performance of a MEMS actuator device. In such embodiments, motion control flexures 24a and 24b may be designed to absorb a force or load during a shock event (e.g., dropping a device containing the MEMS actuator). For example, in particular embodiments, motion control flexures 24a and 24b may be designed to survive the inertial load due to a motion stage for the MEMS actuator (not illustrated) and at least one of the three comb array pairs (10a, 10c, 10e), and (10b, 10d, 10f). In specific implementations of these embodiments, this inertial load may be between 200 and 800 mN.

Figure 1D:
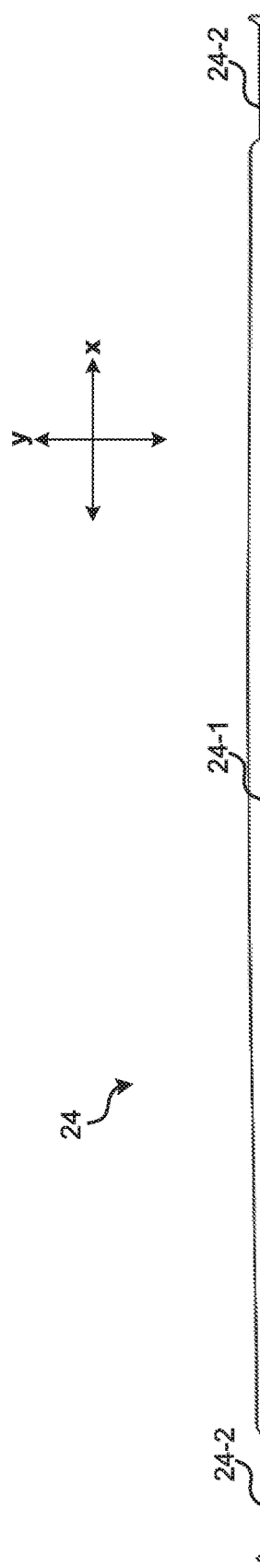
FIG. 1D illustrates a tapered motion control flexure for an actuator that may be used in embodiments to absorb an inertial load during mechanical shock events.

FIG. 1D illustrates a particular design for a tapered motion control flexure 24 that may be used in embodiments to absorb an inertial load during shock events. In embodiments, motion control flexure 24 may survive a loading force between 100 and 400 mN before entering a buckled state (i.e., before deforming).

As shown, motion control flexure 24 includes two thin, soft hinges 24-2 and a wide, stiff rod 24-1 connecting the two hinges. In embodiments, rod 24-1 may be between 1 and 4 millimeters (mm) long in the x direction and between 10 and 50 μm wide in the y direction. In embodiments, hinges 24-2 may be between 0.05 and 0.3 mm long in the x direction and between 1 and 10 μm wide in the y direction. In these embodiments, the dimensions of hinges 24-2 may be optimized to achieve a required stiffness or to avoid buckling. As shown in this particular embodiment, rod 24-1 is tapered along its length such that it is widest at its center and narrowest at its ends. This tapered design, in some embodiments, permits motion control flexure 24 to survive a larger loading force before entering a buckled state. In particular implementations of this embodiment, tapered rod 24-1 may be between 35 and 50 μm wide at its center and between 20 and 40 μm wide at its ends. In one particular embodiment, stiff-rod 24-1 is about 50 μm wide at its center, about 35 μm wide at its end, and capable of taking an inertial load of about 280 mN before buckling. In alternative embodiments, stiff-rod 24-1 may be uniformly wide along its entire length.

Figure 1E:
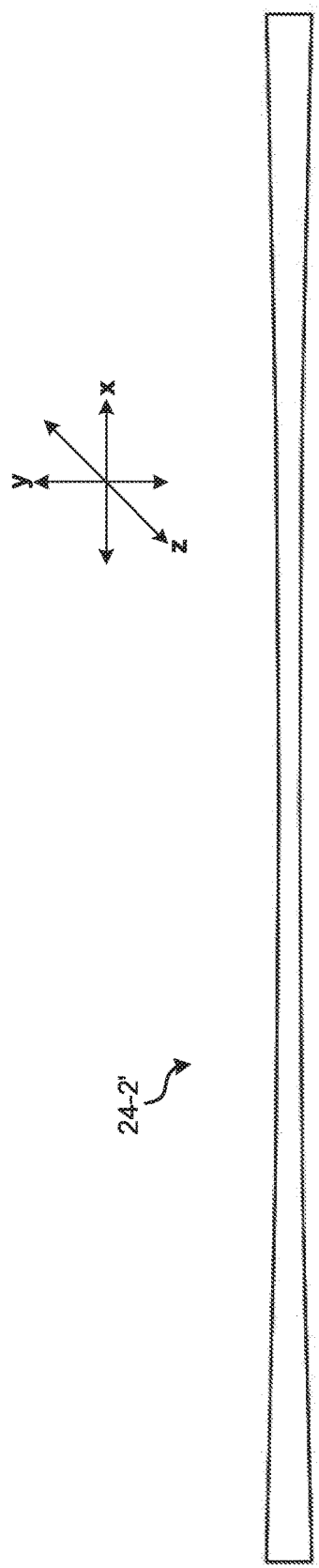
FIG. 1E illustrates a design for a hinge of a motion control flexure that may be used in embodiments to reduce stress experienced by the hinges of the motion control flexure during mechanical shock events and normal operation.

FIG. 1E illustrates a particular design for hinge 24-2' for a motion control flexure (e.g., flexure 24) that may be used in embodiments to reduce stress experienced by the hinges of the motion control flexure during shock events and normal operation. As illustrated, hinge 24-2' is tapered along its length such that it is narrowest at its center and widest at its ends (in the y direction). For example, hinge 24-2' may be about 5 μm wide at its center and about 6 μm wide at its ends (in the y direction). Although not shown in FIG. 1E, hinge 24-2' is also tapered in the z direction such that it is thickest at its ends and thinnest at its center. In other words, hinge 24-2' has a three-dimensional hourglass geometry. The hourglass geometry increases the amount of material on the end portions of hinge 24-2' (e.g., the ends connected to the actuator and rod of the flexure) while reducing the amount of material on the center portion of hinge 24-2'. As the end portions of hinge 24-2' tend to be the weakest portions of the motion control flexure, the hourglass geometry may redistribute the stress experienced during a shock event, resulting in a more durable flexure.

Figure 2A:
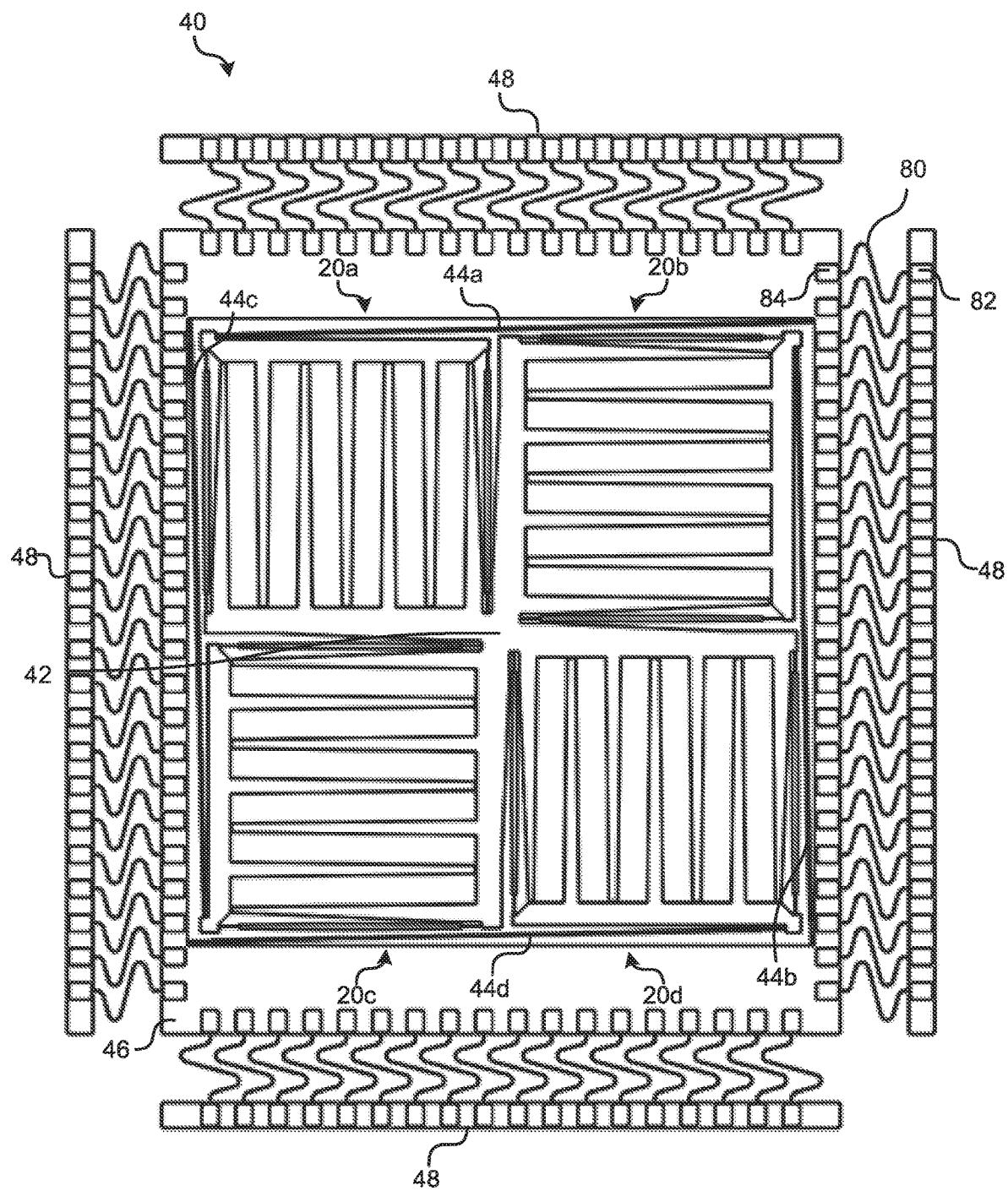
FIG. 2A illustrates a plan view of an MEMS actuator in accordance with example embodiments of the disclosed technology.

FIG. 2A illustrates a plan view of an example MEMS multi-dimensional actuator 40 in accordance with example embodiments of the present disclosure. As illustrated in this embodiment, actuator 40 includes an outer frame 48 (divided into four sections) connected to inner frame 46 by one or more spring elements or flexures 80, four bidirectional comb drive actuators 20a-d, and one or more cantilevers 44a-d including a first end connected to one end of comb drive actuators 20a-d and a second end connected to inner frame 46. Although FIG. 2A illustrates an example actuator 40 including four comb drive actuators 20, in other embodiments, actuator 40 may include a different number of comb drive actuators 20.

In embodiments, actuator 40 includes an anchor 42 that is rigidly connected or attached to first and/or second frame pieces 22a-22b of one or more comb drive actuators 20, such that anchor 42 is mechanically fixed with respect thereto. Thus, for example, if first frame piece 22a is attached to anchor 32, movement of second frame piece 22b relative to first frame piece 22a may also be considered movement relative to anchor 42.

During operation of actuator 40, comb drive actuators 20a-d may apply a controlled force between inner frame 46 and anchor 42. One or more comb drive actuators 20a-d may be rigidly connected or attached to anchor 42, and anchor 42 may be mechanically fixed (e.g., rigidly connected or attached) with respect to outer frame 48. In one embodiment, a platform is rigidly connected or attached to outer frame 48 and to anchor 42. In this manner, the platform may mechanically fix outer frame 48 with respect to anchor 42 (and/or vice versa). Inner frame 46 may then move with respect to both outer frame 48 and anchor 42, and also with respect to the platform. In one embodiment, the platform is a silicon platform. The platform, in various embodiments, is an optoelectronic device, or an image sensor, such as a charge-coupled-device (CCD) or a complementary-metal-oxide-semiconductor (CMOS) image sensor.

In embodiments, the size of actuator 40 may be substantially the same as the size as the platform, and the platform may attach to outer frame 48 and anchor 42, thus mechanically fixing anchor 42 with respect to outer frame 48. In another embodiment of actuator 40, the platform is smaller than actuator 40, and the platform attaches to inner frame 46. In this particular embodiment, outer frame 48 is fixed (or rigidly connected or attached) relative to anchor 42, and inner frame 46 is moved by the various comb drive actuators 20a-d.

In one embodiment, two comb drive actuators 20a and 20d actuate along a first direction or axis in the plane of actuator 40 (e.g., east/west, or left/right), and two comb drive actuators 20b and 20c actuate along a second direction or axis in the plane of actuator 40 (e.g., north/south, or top/bottom). The first and second directions may be substantially perpendicular to one another in the plane of actuator 40.

Various other configurations of comb drive actuators 20a-d are possible. Such configurations may include more or less comb drives 10 in each of the comb drive actuators 20a-d, and various positioning and/or arrangement of comb drive actuators 20a-d, for example, to enable actuation in more or less degrees of freedom (e.g., in a triangular, pentagonal, hexagonal formation, or the like).

In embodiments, cantilevers 44a-d are relatively stiff in the respective direction of motion of the respective comb drive actuators 20a-d, and are relatively soft in the in-plane orthogonal direction. This may allow for comb drive actuators 20a-d to effect a controlled motion of inner frame 46 with respect to anchor 42 and hence with respect to outer frame 48. In embodiments, illustrated by FIG. 2A, outer frame 48 is not continuous around the perimeter of actuator 40, but is broken into pieces (e.g., two, three, four, or more pieces). Alternatively, in other embodiments, outer frame 48 may be continuous around the perimeter of actuator 40. Similarly, inner frame 46 may be continuous or may be divided into sections.

In various embodiments, electrical signals may be delivered to comb drive actuators 20a-d via routing on or in cantilevers 44a-d. In some instances, two or more different voltages may be used in conjunction with comb drive actuator 20a. In such instances, two electrical signals may be routed to comb drive actuator 20a via first and second conductive layers 45 and 47, respectively, of cantilever 44a. Once delivered to comb drive actuator 20a, the two electrical signals may be routed, for example, via first frame piece 22a, to comb finger arrays 16a and 15b, respectively.

In another example implementation of actuator 40, two electrical signals used to develop motive forces in comb drive actuator 20b may also be used to develop similar motive forces in comb drive actuator 20c. In such an implementation, rather than routing these two electrical signals to comb drive actuator 20c through cantilever 44c, the two electrical signals may be routed to comb drive actuator 20c from comb drive actuator 20b. By way of example, this may entail routing the two electrical signals from an electrical contact pad 84, through cantilever 44b to a first frame piece 22a of comb drive actuator 20b. In addition, the two electrical signals may be routed from first frame piece 22a via flexures 24a-b (respectively) and second frame piece 22b to anchor 42. The two electrical signals may then be routed through anchor 42 to comb drive actuator 20c. It will be appreciated that various routing options may be exploited to deliver electrical signals to comb drive actuators 20a-d. For example, multiple routing layers may be utilized in anchor 42, in first or second frame pieces 22a/b, and/or in first and second flexures 24a/b.

Figure 2B:
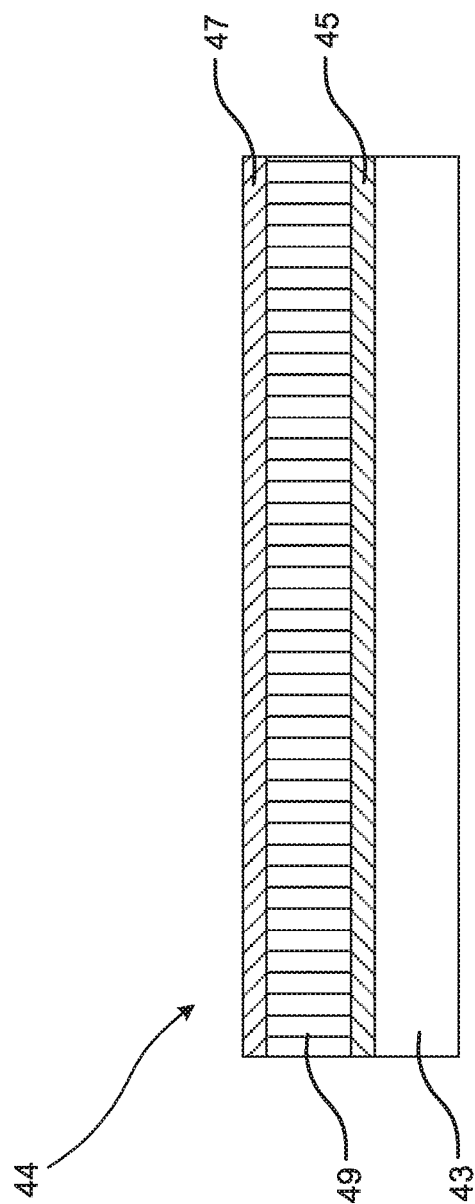
FIG. 2B is a schematic diagram illustrating a cross-sectional view of a cantilever of the actuator of FIG. 2A in accordance with example embodiments of the disclosed technology.

FIG. 2B is a schematic diagram illustrating a cross-sectional view of a portion of a cantilever 44 in accordance with example embodiments of the present disclosure. As illustrated in FIG. 2B, cantilever 44 includes first and second conductive layers 45 and 47, and first and second insulating layers 43 and 49. First and second conductive layers 45 and 47 may, in some example implementations, serve as routing layers for electrical signals, and may include polysilicon and/or metal. Insulating layers 43 and 49 may provide structure for first and second conductive layers 45 and 47. In alternative embodiments of cantilever 44, the order of the conductive and insulating layers may be switched such that layers 43 and 49 are conductive layers and layers 45 and 47 are insulating layers.

In one example implementation of cantilever 44, insulating layers 43 and 49 include silicon dioxide, second conductive layer 47 includes metal, and first conductive layer 45 includes polysilicon. In a variant of this example, a coating (e.g., oxide or the like) may cover second conductive layer 47, e.g., to provide insulation against shorting out when coming into contact with another conductor. Second insulating layer 49 may be a thin layer that includes oxide or the like. Additionally, first conductive layer 45, in some instances, may be relatively thick (compared to the other layers of cantilever 44), and may, for example, include silicon, polysilicon, metal, or the like. In such instances, first conductive layer 45 may contribute more than the other layers to the overall characteristics of cantilever 44, including, for example, the nature, degree, or directionality of the flexibility thereof.

Additional embodiments of cantilever 44 (and cantilevers 44a-d) may include additional conductive layers, such that additional electrical signals may be routed via the cantilever 44. In some embodiments, cantilevers 44a-d may be manufactured in a similar fashion to flexures 24a-24b, though the sizing may be different between the two. Moreover, as would be appreciated by one having skill in the art, additional materials may be used to form the various layers of cantilever 44.

In various embodiments, outer cantilevers 44 may be designed to be resistant to mechanical shock events (e.g., in the event a device including MEMS actuator 40 is dropped). In such embodiments, each cantilever 44 may be designed such that it i) experiences less displacement stress during shock; ii) experiences less radial stiffness during shock; and iii) withstands a high load without buckling. In some embodiments, outer cantilevers 44 may be designed such that they experience a peak stress of less than about 1900 MPa along their length, and less than about 2100 MPa along their width, in the event of a shock FIGS. 2C-2F illustrate four example designs of shock-resistant outer cantilevers that may be implemented in embodiments of the disclosure.

FIG. 2C illustrates an outer cantilever 44e having a forked junction design. As shown, cantilever 44e includes a forked junction 44e-1 at its center. The forked-junction 44e-1 at the center includes an aperture 44e-2 and is wider (in Y direction) than the sides 44e-3 of outer cantilever 44e. In various embodiments, the width (in Y direction) of aperture 44e-2 is between 0.02 and 0.04 millimeters, the maximum width of the forked junction 44e-1 is between 0.06 and 0.12 millimeters, and the width of sides 44e-3 is between 0.012 and 0.050 millimeters. In further embodiments, the total length (in X direction) of cantilever 44e is between 4.5 and 7 millimeters. In alternative embodiments, cantilever 44e may include additional forks (and hence apertures) at its center (e.g. 3, 4, etc.).

FIG. 2D illustrates an outer cantilever 44f having an S-shaped design. It should be noted that although cantilever 44f primarily appears straight along its length in FIG. 2D, it is curved and has a point of inflection (hence the "S-shape") along its length that improves resilience in the event of a mechanical shock by adding flexibility to cantilever 44f. In this embodiment, the two roots or connecting ends 44f-1 of cantilever 44f couple to a center portion 44f-3 via a thinner portion or hinge 44f-2. Cantilever 44f is widest (in Y direction) at its roots 44f-1 and narrowest at the junction 44f-2 between roots 44f-1 and center portion 44f-3. In various embodiments, the total length (x1) of cantilever 44f is between 4.5 and 7 millimeters, and the width (y1) of center portion 44f-3 is between 0.012 and 0.030 millimeters.

Figure 2E:
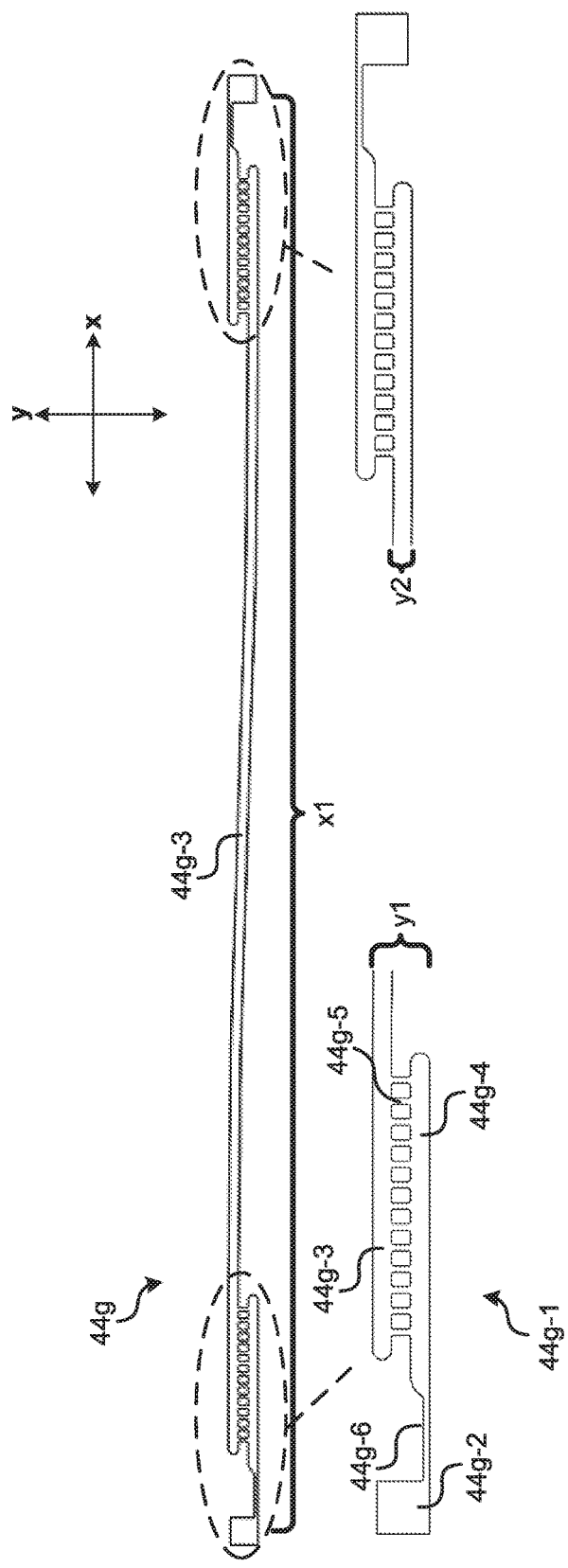
FIG. 2E illustrates a cantilever having an S-shaped design and forked junction that may be implemented in embodiments of the disclosed technology.

FIG. 2E illustrates an outer cantilever 44g having the S-shaped design of cantilever 44f and the added feature of a "toothbrush" shaped or forked junction 44g-1 at each end for relieving stress on cantilever 44g. As illustrated, outer cantilever 44g includes a center portion 44g-3 with ends coupled to end portions 44g-4 that attach to roots 44g-2. In various embodiments, the total length (x1) of cantilever 44g is between 4.5 and 7 millimeters, and the width (y2) of center portion 44g-3 is between 0.012 and 0.030 millimeters.

The forked junction 44g-1 couples each end of center portion 44g-3 to a respective end portion 44g-4 in a direction perpendicular (i.e., Y direction) to the length of cantilever 44g. Each junction 44g-1 includes a plurality of beams 44g-5 that give the junction 44g-1 the appearance of a toothbrush. Although each junction 44g-1 is illustrated as having thirteen beams 44g-5 in this embodiment, in alternative embodiments the number of beams 44g-5 may be decreased or increased (e.g., from 2 to 15) to improve the performance of cantilever 44g during a mechanical shock event (e.g., by reducing peak stress). As illustrated in this particular embodiment, in one junction the end portion 44g-4 is below (Y direction) its corresponding center portion 44g-3, and in the other junction the end portion 44g-4 is above (Y direction) its corresponding center portion 44g-3. Also illustrated in this particular embodiment, the root 44g-2 attached to the end portion 44g-4 by hinge 44g-6 below the center portion 44g-3 points upward, whereas the other root 44g-2 points downward. In particular embodiments, the total width (y1) of a forked junction 44g-1, including the end of center portion 44g-3, end portion 44g-4, and beams 44g-5, is between 0.040 and 0.150 millimeters.

Figure 2F:
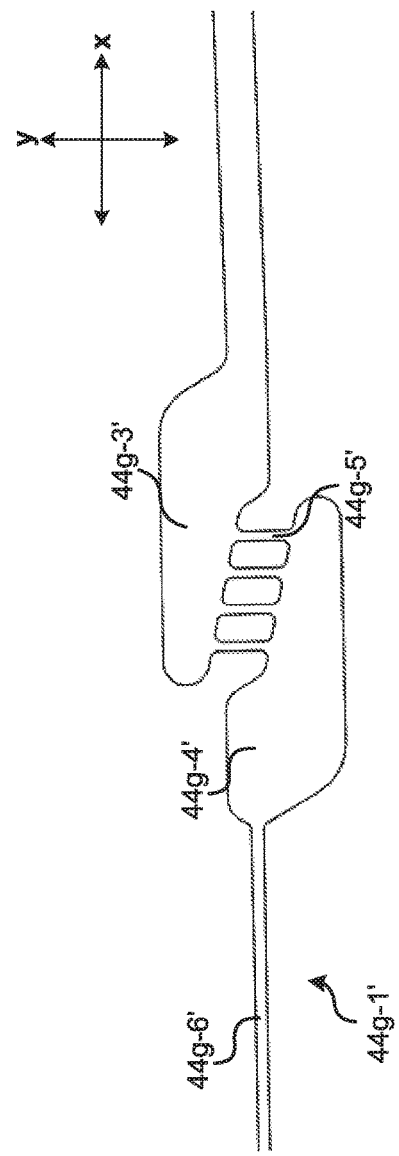
FIG. 2F illustrates an alternative embodiment of a forked junction that may be used in the cantilever of FIG. 2E.

FIG. 2F illustrates an alternative embodiment of a forked junction 44g-1' that may be used in place of forked junction 44g-1 in cantilever 44g to relieve stress. As illustrated in this particular implementation, the end 44g-3' of the center portion of cantilever 44g is tapered along its length (X direction) such that its width (Y direction) decreases in a direction toward the root (not shown) of the cantilever. The end 44g-3' attaches to a corresponding tapered end portion 44g-4' that is tapered along its length such that its width decreases in a direction away from the root. Because the width (Y direction) of the two ends 44g-4' and 44g-3' is substantially less along their junction point, this tapered design permits a greater length of beams 44g-5' in a direction roughly perpendicular to cantilever 44g (Y direction).

A hinge 44g-6' extends from a root (not shown) and connects to forked junction end 44g-4'. In embodiments, hinge 44g-6' may have the same three-dimensional hourglass geometry as described above with respect to hinge 24-2' of FIG. 1E. As the junctions connecting hinge 44g-6' to the cantilever root and end 44g-4' may be the weakest portions of the outer cantilever, the hourglass geometry may redistribute the stress experienced during a shock event, resulting in a more durable cantilever. In embodiments, hinge 44g-6' may be about 5 µm wide at its center and about 6 µm wide at its ends (in the y direction), and about 0.2 mm long (in the x direction).

Referring back to FIG. 2A, actuator 40 includes one or more flexures or spring elements 80 connecting inner frame 46 to outer frame 48. Flexures 80 may be electrically conductive and may be soft in all movement degrees of freedom. In various embodiments, flexures 80 route electrical signals between electrical contact pads 82 on outer frame 48 to electrical contact pads 84 on inner frame 46. These electrical signals may subsequently be routed to one or more comb drive actuators 20 through one or more cantilevers 44a-44d. In example implementations, flexures 80 come out from inner frame 46 in one direction, two directions, three directions, or in all four directions.

In one embodiment, actuator 40 is made using MEMS processes such as, for example, photolithography and etching of silicon. Actuator 40, in some cases, moves +/−150 micrometers in plane, and flexures 80 may be designed to tolerate this range of motion without touching one another (e.g., so that separate electrical signals can be routed on the various spring elements 80). For example, flexures 80 may be S-shaped flexures ranging from about 1 to 5 micrometers in thickness, about 1 to 40 micrometers wide, and about 150 to 1000 micrometers by about 150 to 1000 micrometers in the plane.

In order for flexures 80 to conduct electricity well with low resistance, flexures 80 may contain, for example, heavily doped polysilicon, silicon, metal (e.g., aluminum), a combination thereof, or other conductive materials, alloys, and the like. For example, flexures 80 may be made out of polysilicon and coated with a roughly 0.2~1 micrometer thick metal stack of Aluminum, Nickel, and Gold. In one embodiment, some flexures 80 are designed differently from other flexures 80 in order to control the motion between outer frame 48 and inner frame 46. For example, four to eight (or some other number) of flexures 80 may have a thickness between about 10 and 250 micrometers. Such a thickness may somewhat restrict out-of-plane movement of outer frame 48 with respect to inner frame 46.

In particular embodiments, flexures 80 are low stiffness flexures that operate in a buckled state without failure, thereby allowing the stiffness of the flexures to be several orders of magnitude softer than when operated in a normal state. In these embodiments, a buckled section (i.e., flexible portion) of flexures 80 may be designed such that a cross section of the flexible portion along its direction of bending (i.e., thickness and width) is small, while its length is relatively long. Particular embodiments of flexures 80 are described in greater detail in U.S. patent application Ser. No. 14/677,730 titled "Low Stiffness Flexure", filed Apr. 2, 2015.

As noted above with respect to FIG. 2A, a MEMS actuator may be designed with an outer frame 48 coupled to an inner frame 46 by a plurality of flexures 80. During operation, inner frame 46 may collide with outer frame 48 in the event of a sudden shock. Accordingly, in embodiments, shock stops may be included in the outer and inner frames to protect the MEMS actuator structure in the event of shock.

FIGS. 3A-3B illustrate one such embodiment of a MEMS actuator 100 including shock stops. As illustrated in this particular embodiment, MEMS actuator 100 comprises an inner frame 110 and an outer frame 120 that may be coupled by a plurality of flexures (not pictured). As shown in this embodiment, outer frame 120 includes four electrical bars 121-124. In other embodiments outer frame 120 may be one piece. A pair of shock stops 127 and 111 corresponding to outer frame 120 and inner frame 110, respectively. In this particular embodiment of actuator 100, four pairs of shock stops 127 and 111 (one for each corner) are present to absorb kinetic energy of shock collisions between outer frame 120 and inner frame 110 in the event of a shock. However, as would be appreciated by one having skill in the art, any number of shock stop pairs could be implemented in alternative implementations of a MEMS actuator or other MEMS device that experiences collisions between two portions of the device.

In various embodiments, shock stops 127 and 111 may be designed to maximize the amount of kinetic energy they can absorb upon impact (e.g., when horizontal or vertical stop 127 collides with stop 111) due to a shocking event without experiencing permanent deformation. For example, in embodiments shock stops 127 and 111 may be designed to absorb a combined kinetic energy of between 100 and 400

μJ. In particular embodiments, shock stops 127 and 111 may absorb a combined kinetic energy of between 300 and 400 μJ.

Figure 3C:
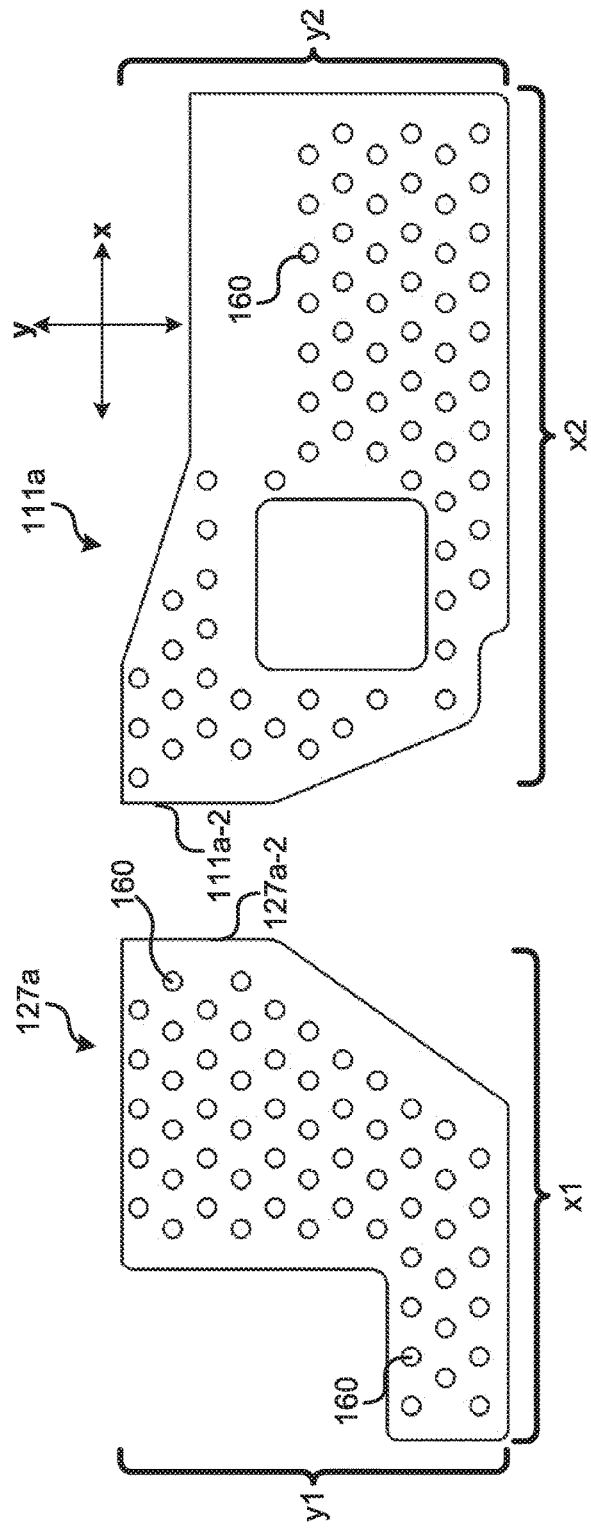
FIG. 3C illustrates a pair of shock stops that may be implemented in embodiments of the disclosed technology.
Figure 3D:
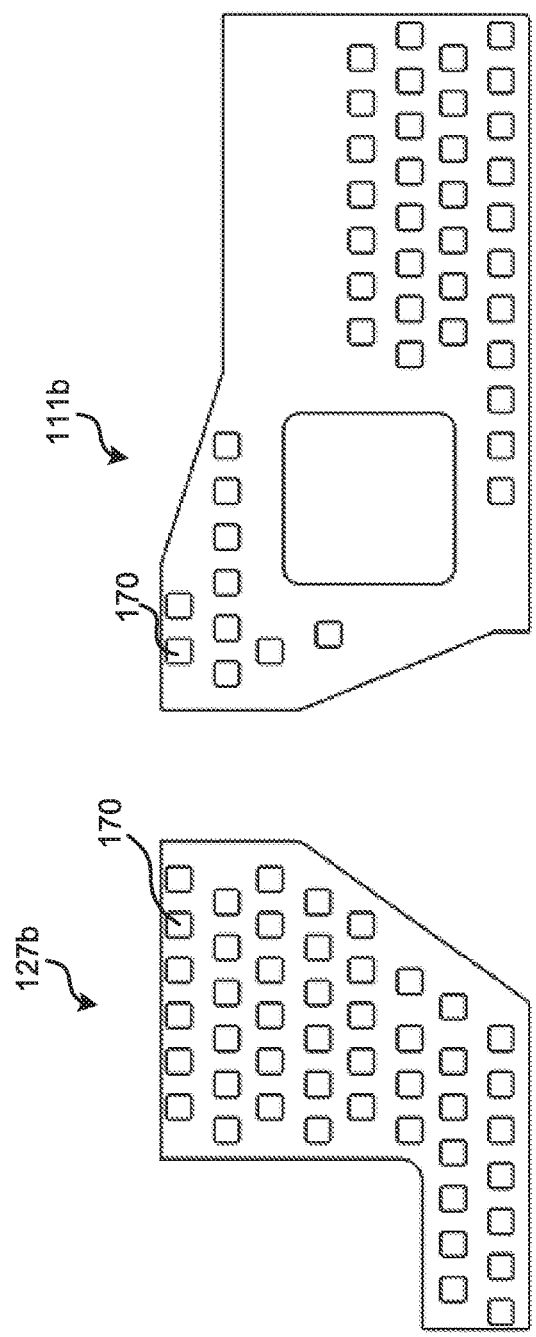
FIG. 3D illustrates a pair of shock stops that may be implemented in embodiments of the disclosed technology.

FIGS. 3C-3D illustrates two exemplary designs of shock stops 127 and 111 that may be implemented in embodiments of the technology disclosed herein. FIG. 3C illustrates shock stops 127a and 111a comprising a plurality of circular, staggered apertures 160. In the event of a shock, surface 127a-2 of stop 127a contacts surface 111a-2 of shock 111a. As illustrated in this particular embodiment, the apertures 160 are spaced apart in a concentrated, hexagonal pattern. In various embodiments, the diameters of the circular apertures may be between 0.010 and 0.022 millimeters. In particular embodiments, the diameter of the circular apertures is about 16 μm. In particular embodiments, shock stops 127a and 111a may absorb a combined energy of about 350 μJ and each deform up to about 40 μm before breaking. In alternative implementations of shock stops 127a and 11a, apertures 160 may be filled with epoxy glue or other energy absorbing material to adjust their stiffness as well as capability of absorbing energy, and/or arranged in a different pattern (e.g., triangular, rectangular, linear, or other pattern). In various embodiments, the total length ($x_1$) of shock stop 127a is between 0.250 and 1.000 millimeters, and the total width ($y_1$) of shock stop 127a is between 0.0250 and 1.000 millimeters. In various embodiments, the total length ($x_2$) of shock stop 111a is between 0.300 and 1.200 millimeters, and the total width ($y_2$) of shock stop 111a is between 0.0250 and 1.000 millimeters.

FIG. 3D illustrates shock stops 127b and 111b comprising a plurality of square, staggered apertures 170. Similar to FIG. 3C, the apertures 170 are spaced apart in a concentrated, hexagonal pattern. In particular embodiments, shock stops 127b and 111b may absorb a combined energy of about 300 μJ and each deform up to about 15 μm before breaking. In alternative implementations of shock stops 127b and 111b, apertures 170 may be filled with epoxy glue or other energy absorbing material to adjust their stiffness as well as capability of absorbing energy, and/or arranged in a different pattern (e.g., triangular, rectangular, linear, or other pattern).

In yet further embodiments of the technology disclosed herein, other alternative shock stop designs may be implemented to tune the maximum energy they can absorb and the maximum amount of distance they may displace without breaking. For example, horizontal or vertical slits may be used instead of or in combination with the aforementioned apertures.

Figure 4A:
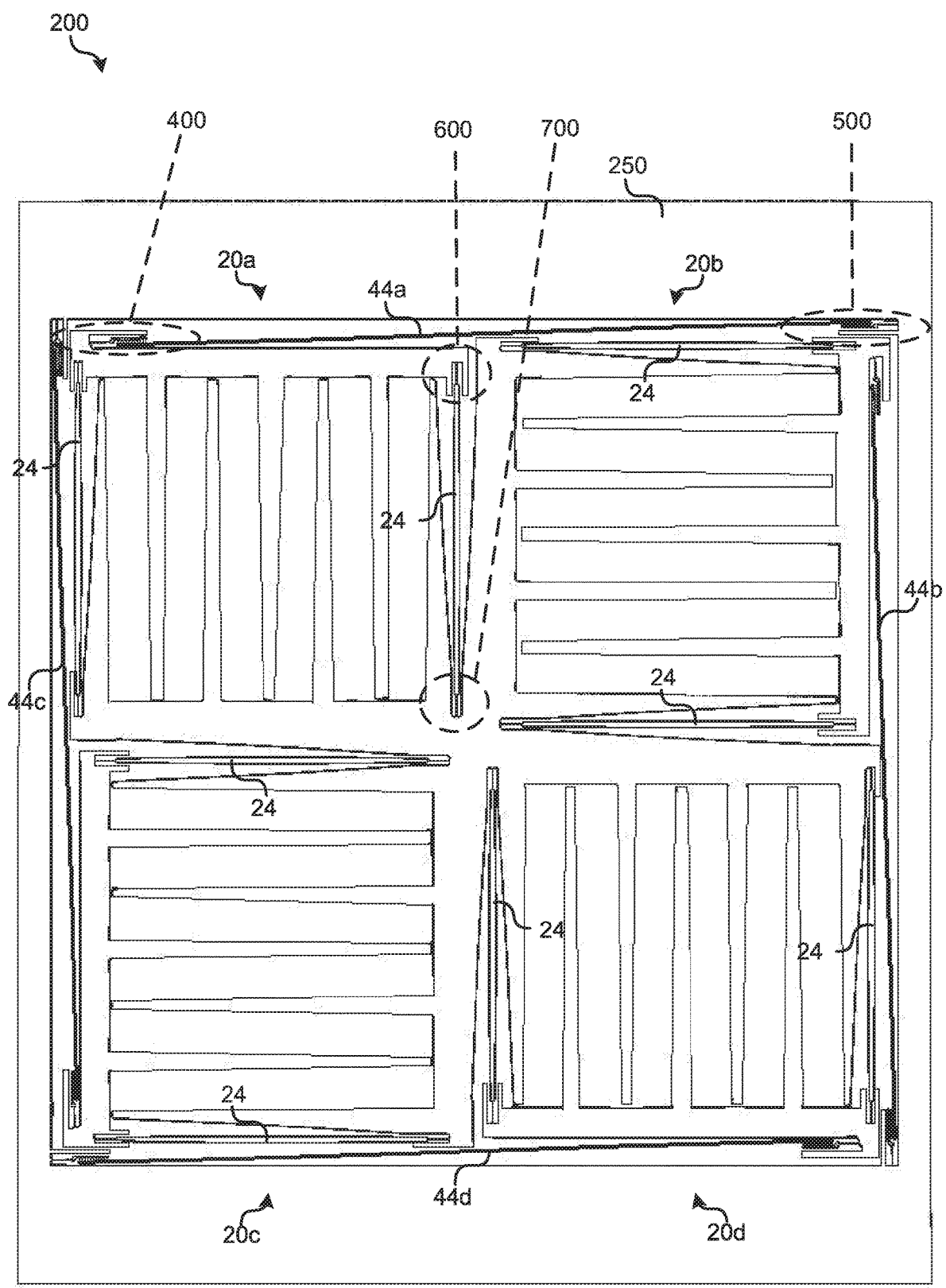
FIG. 4A illustrates a plan view of a section of an example MEMS multi-dimensional actuator that utilizes shock caging structures in accordance with example embodiments of the present disclosure.

FIG. 4A illustrates a plan view of a section of an example MEMS multi-dimensional actuator 200 that utilizes shock caging structures in accordance with example embodiments of the present disclosure. As illustrated in this embodiment, actuator 200 includes four bidirectional comb drive actuators 20a-d, and one or more cantilevers 20a-d including a first end connected to one end of bidirectional comb drive actuators 20a-d and a second end connected to an inner frame 250. Like actuator 40, actuator 200 may move in multiple degrees of freedom under a control force applied by comb drive actuators 20a-d between inner frame 250 and a central anchor (not shown).

In this embodiment, actuator 200 additionally includes shock caging structures 400, 500, 600, and 700 that limit the motion or maximum displacement of cantilevers 44a-d and motion control flexures 24 of comb drive actuators 20a-d in a direction perpendicular to their length. This limits or prevents large amplitude oscillations from occurring perpendicular to the length of the beam. In various embodiments, the shock caging structures may be solid silicon structures that do not displace substantially when they are contacted by cantilevers 44a-d or motion control flexures 24. In implementations of these embodiments, the shock caging structures are shaped such that the cantilevers 44a-d or motion control flexures 24 contact a maximum amount of the surface area of the caging structure during a shock event.

As illustrated in this embodiment, actuator 200 includes four distinct shock caging configurations or structures: structures 400 and 500 for caging cantilevers 44a-44d, and structures 600 and 700 for caging motion control flexures 24. As would be appreciated by one having skill in the art, in various embodiments the shock caging structures need not be limited to the precise configurations illustrated herein, and may be implemented to limit the movement of any moving beam in a MEMS device.

Shock caging structures 400 and 500 limit the motion of cantilevers 44a-44d and may be formed as a part of inner frame 250 or a moving frame 22a of comb drive actuators 20a-20d. For example, as illustrated in this embodiment, shock caging structure 400 is formed as part of a moving of frame 22a of a comb drive actuator 20a-20d whereas shock caging structure 500 is formed as part of the inner frame 250.

Shock caging structures 600 and 700 limit the motion of motion control flexures 24 and may be formed as a part of the fixed or moving frames (e.g., frame pieces 22a-22b) of comb drive actuators 20a-20d. For example, shock caging structures 700 may be a part of the fixed frame 22b of comb drive actuators 20a-20d whereas shock caging structures 600 may be a part of the moving frame 22a of comb drive actuators 20a-20d. The caging structures may be formed by shifting comb drive actuators 20a-20d further away from the center of the actuator.

Figure 4B:
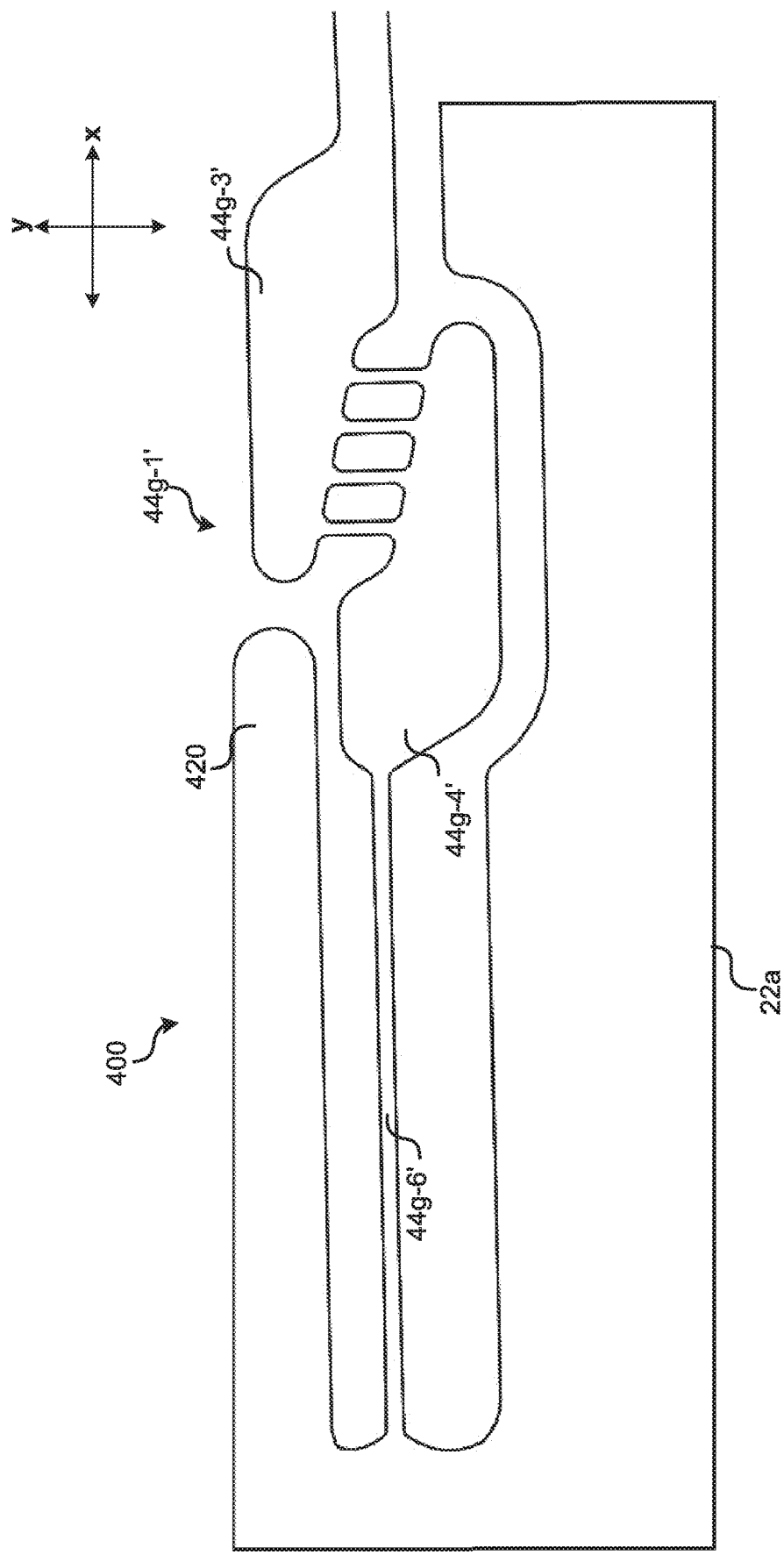
FIG. 4B illustrates a shock caging structure for caging a cantilever in accordance with an embodiment of the present disclosure.

FIG. 4B illustrates a shock caging structure 400 for caging a cantilever 44 in accordance with an embodiment. Caging structure 400 (e.g., a rigid silicon structure) surrounds an end of cantilever 44. In this embodiment, caging structure 400 is a part of a moving frame 22a of a comb drive actuator 20.

Caging structure 400 includes a protrusion 420 above hinge 44g-6' that extends parallel to and past the hinge. In this example, protrusion 420 terminates above end 44g-4' of the forked junction 44g-1'. Accordingly, in the event of a shock, end 44g-4' contacts stiff protrusion 420 and does not vertically displace in the y direction past stiff protrusion 420. Following this configuration, the motion of thin hinge 44g-6', which may be the weakest portion of cantilever 44, is substantially limited during a shock event. For example, with the caging structure 400, hinge 44g-6' may displace about 10 times less in the y direction. In alternative embodiments, protrusion 420 may terminate above end 44g-3' of the forked junction 44g-1' or even further.

The length of protrusion 420 and the vertical gap between forked junction 44g-1' and caging structure 420 may be tuned in various embodiments to maximize the amount of mechanical shock protection provided while ensuring that cantilever 44 has enough space to move during regular operation. In specific embodiments, protrusion 420 may be between 150 and 300 micrometers long, and the gap between end 44g-4' and caging structure 320b (below or above the forked junction) may be between 3 and 20 micrometers.

Figure 4C:
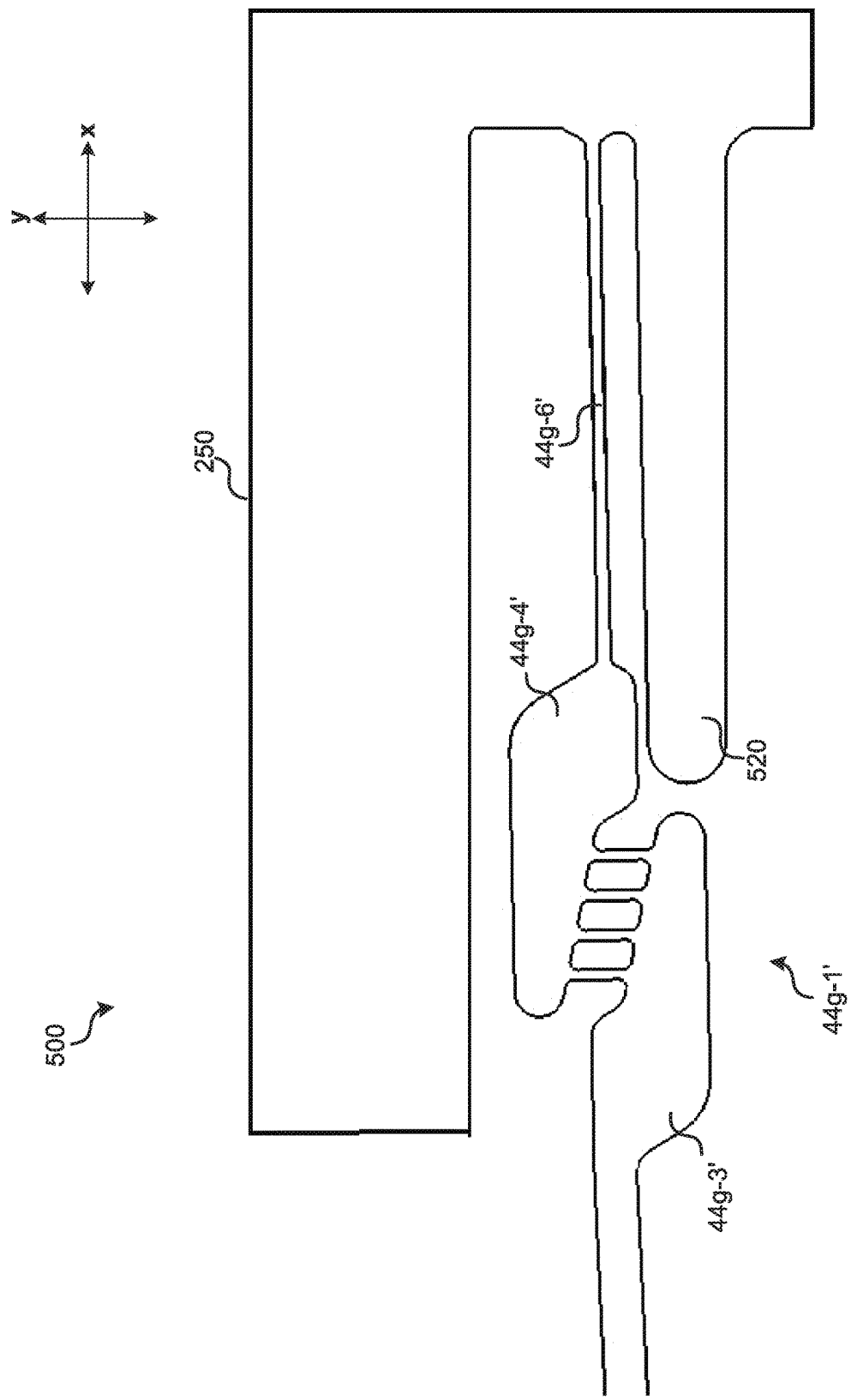
FIG. 4C illustrates a shock caging structure for caging a cantilever in accordance with an embodiment of the present disclosure.

FIG. 4C illustrates a shock caging structure 500 for a caging a cantilever 44 in accordance with an embodiment. A caging structure 500 (e.g., a rigid silicon structure) surrounds an end of a cantilever 44. In this embodiment, caging structure 500 is a part of inner frame 250 of actuator 200.

Caging structure 500 includes a protrusion 520 below hinge 44g-6' that extends parallel to and past the hinge. In this example, protrusion 520 terminates below end 44g-4' of the forked junction 44g-1'. Accordingly, in the event of a mechanical shock, end 44g-4' contacts stiff protrusion 520 and does not displace downward in the y direction past stiff protrusion 520, or upward in the y direction past the wall of inner frame 250. Following this configuration, the motion of thin hinge 44g-6', which may be the weakest portion of cantilever 44, is substantially limited during a shock event. For example, with the caging structure, hinge 44g-6' may displace about 10 times less in the y direction. In alternative embodiments, protrusion 520 may terminate below end 44g-3' of the forked junction 44g-1' or even further.

The length of protrusion 520 and the vertical gap between forked junction 44g-1' and caging structure 500 may be tuned in various embodiments to maximize the amount of shock protection provided while ensuring that cantilever 44 has enough space to move during regular operation. In specific embodiments, protrusion 520 may be between 150 and 300 micrometers long, and the gap between end 44g-4' and caging structure 500 (below or above the forked junction) may be between 3 and 20 micrometers.

Figure 4D:
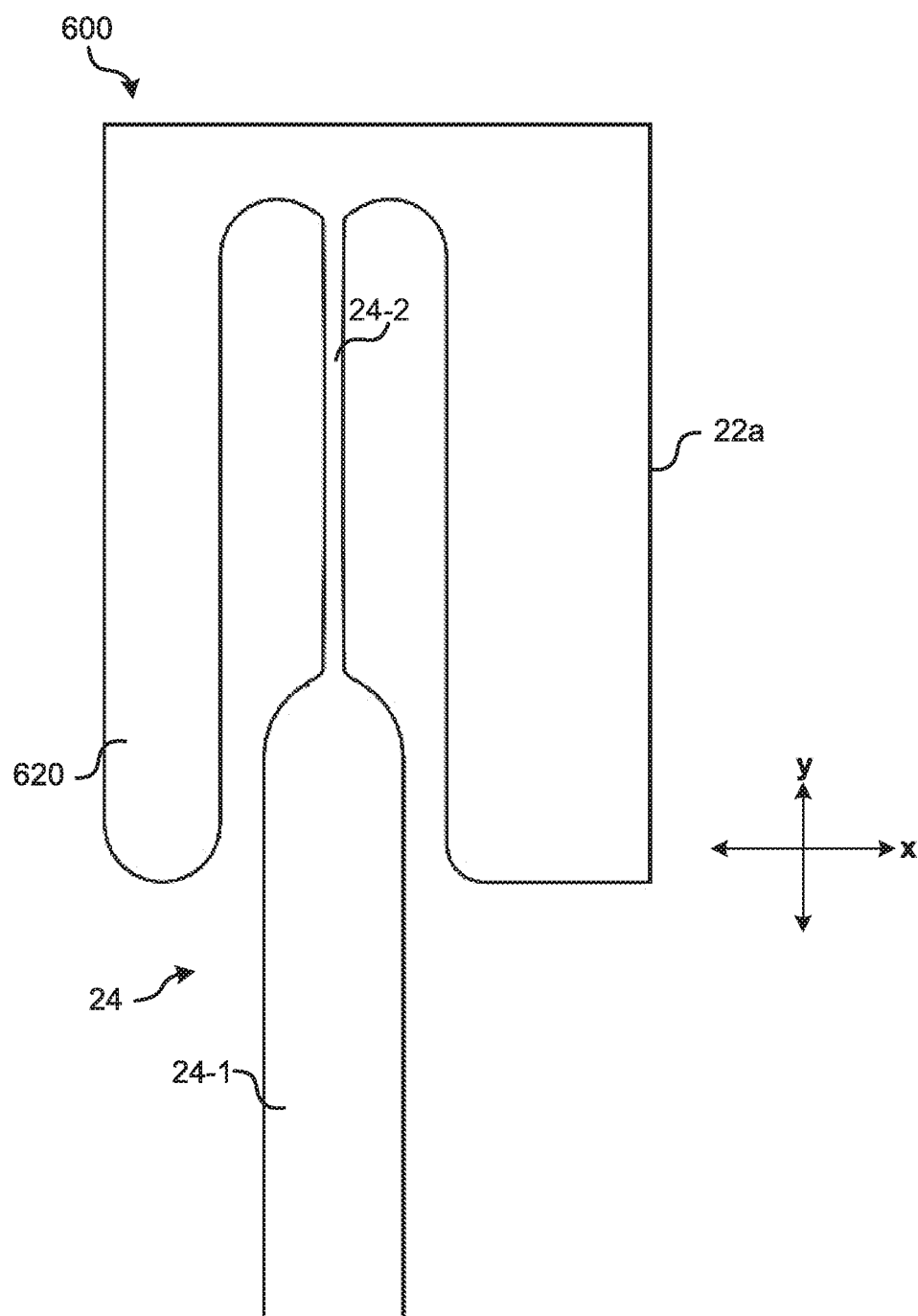
FIG. 4D illustrates a shock caging structure for caging a motion control flexure in accordance with an embodiment of the present disclosure.

FIG. 4D illustrates a shock caging structure 600 for caging a motion control flexure 24 in accordance with an embodiment. A caging structure 600 (e.g., a rigid silicon structure) surrounds an end of motion control flexure 24. In this embodiment, caging structure 600 is a part of a moving frame 22a of a comb drive actuator 20.

Caging structure 600 includes a protrusion 620 to the side of hinge 24-2 that extends parallel to and past the hinge. In this example, protrusion 620 terminates at an end of rod 24-1 of motion control flexure 24. Accordingly, in the event of a shock, the end of rod 24-1 contacts stiff protrusion 620 and does not horizontally displace in the left x direction past stiff protrusion 620 or in the right x direction past frame 22a. Following this configuration, the motion of thin hinge 24-2, which may be the weakest portion of motion control flexure 24, is substantially limited during a shock event. For example, with the caging structure 600, hinge 24-2 may displace about 10 times less in the x direction.

The length of protrusion 620 and the horizontal gap between the end of rod 24-1 and caging structure 600 may be tuned in various embodiments to maximize the amount of shock protection provided while ensuring that flexure 24 has enough space to move during regular operation. In specific embodiments, protrusion 620 may be between 100 and 225 micrometers long, and the gap between rod 24-1 and caging structure 600 (to the left or right of the rod) may be between 4 and 20 micrometers.

Figure 4E:
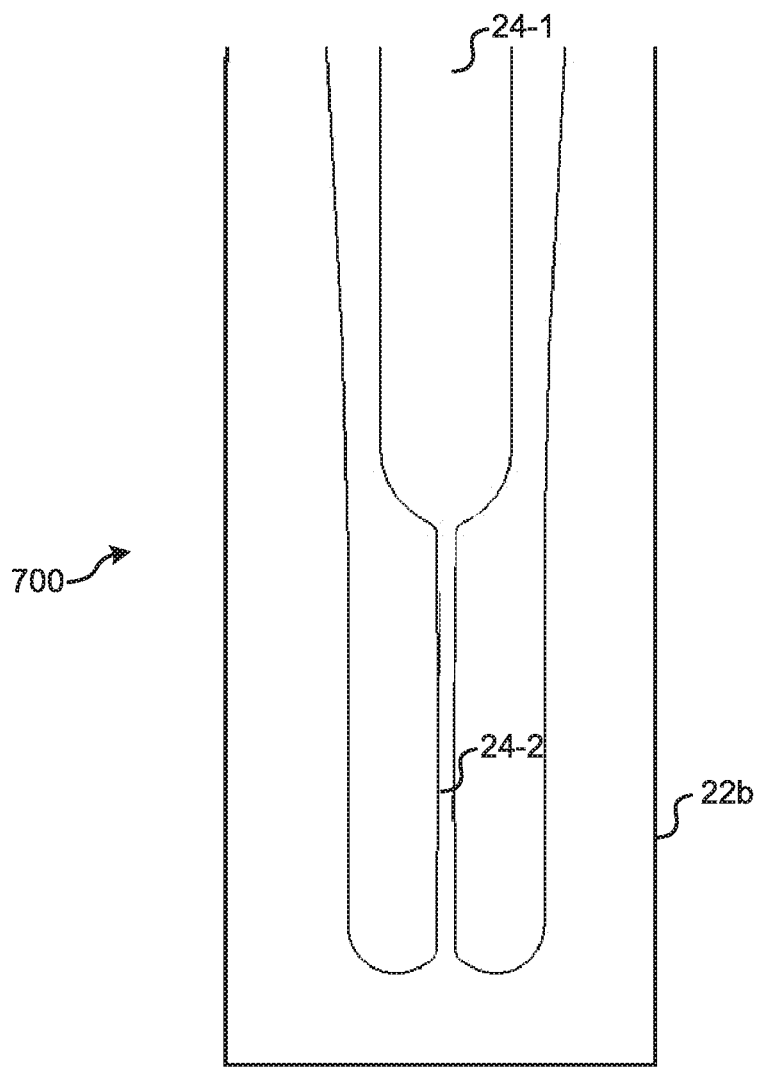
FIG. 4E illustrates a shock caging structure for caging a motion control flexure in accordance with an embodiment of the present disclosure.

FIG. 4E illustrates a shock caging structure 700 for caging a motion control flexure 24 in accordance with an embodiment. A caging structure 700 (e.g., a rigid silicon structure) surrounds an end of motion control flexure 24. In this embodiment, caging structure 700 is a part of a fixed frame 22b of a comb drive actuator 20. Frame 22b surrounds an end of rod 24-1 of motion control flexure 24. Accordingly, in the event of a shock, the end of rod 24-1 does not horizontally displace past the walls of the frame. Following this configuration, the motion of thin hinge 24-2, which may be the weakest portion of motion control flexure 24, is substantially limited during a shock event.

Figure 5A:
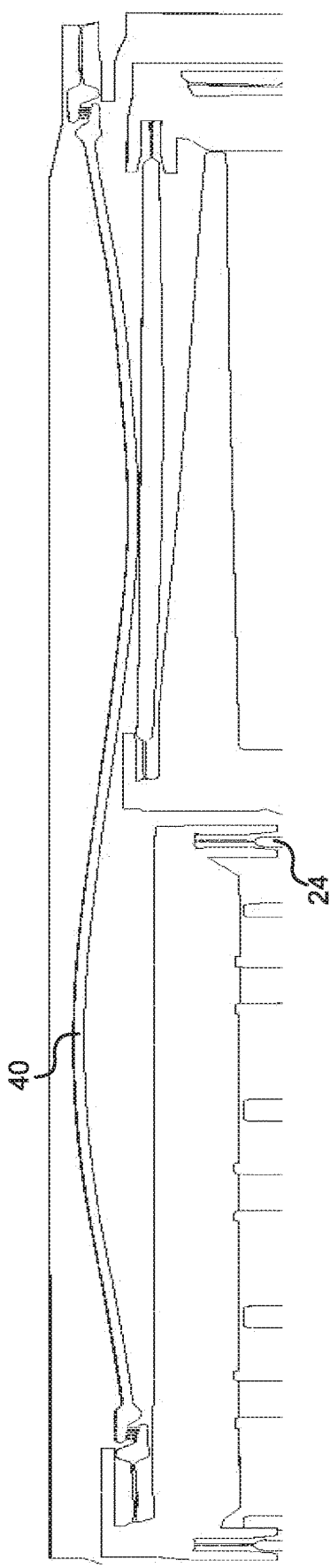
FIG. 5A illustrates an example model of a mechanical shock event of a MEMS actuator including shock caging structures for its cantilevers and motion control flexures.
Figure 5B:
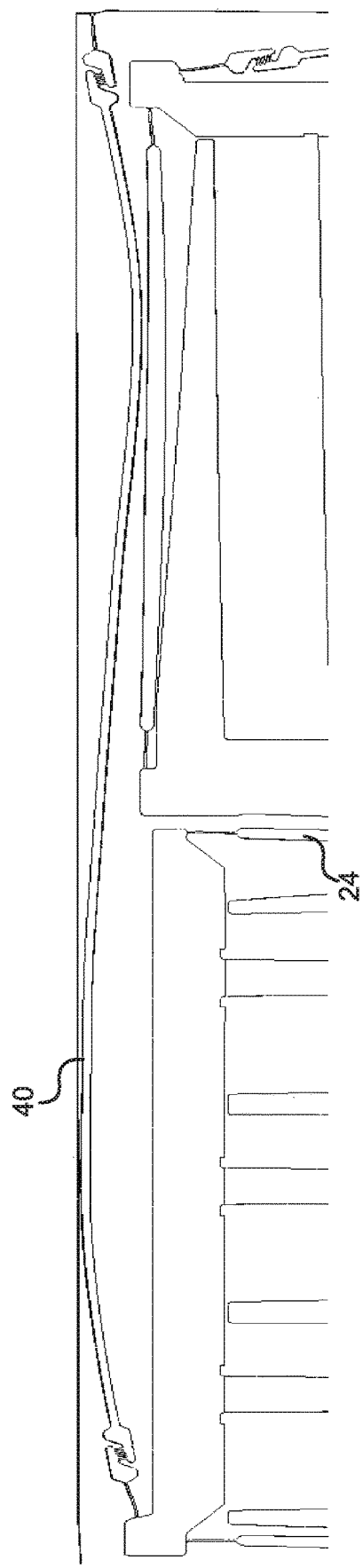
FIG. 5B illustrates an example model of a mechanical shock event of a MEMS actuator not including shock caging structures for its cantilevers and motion control flexures.

FIG. 5A illustrates an example model at a moment during a mechanical shock event of a MEMS actuator including shock caging structures for its cantilevers 44 and motion control flexures 24. The shock caging structures limit the motion experienced by cantilevers 44 and motion control flexures 24. Less stress is placed on the hinges of cantilevers 44 and flexures 24. FIG. 5B illustrates an example model at a moment during a mechanical shock event of a MEMS actuator not including shock caging structures for its cantilevers 44 and motion control flexures 24. Without the shock caging structures, cantilevers 44 and motion control flexures 24 freely flail and oscillate between the moving frames. The hinges of cantilevers 44 and motion control flexures 24 experience greater stress.

Figure 6A:
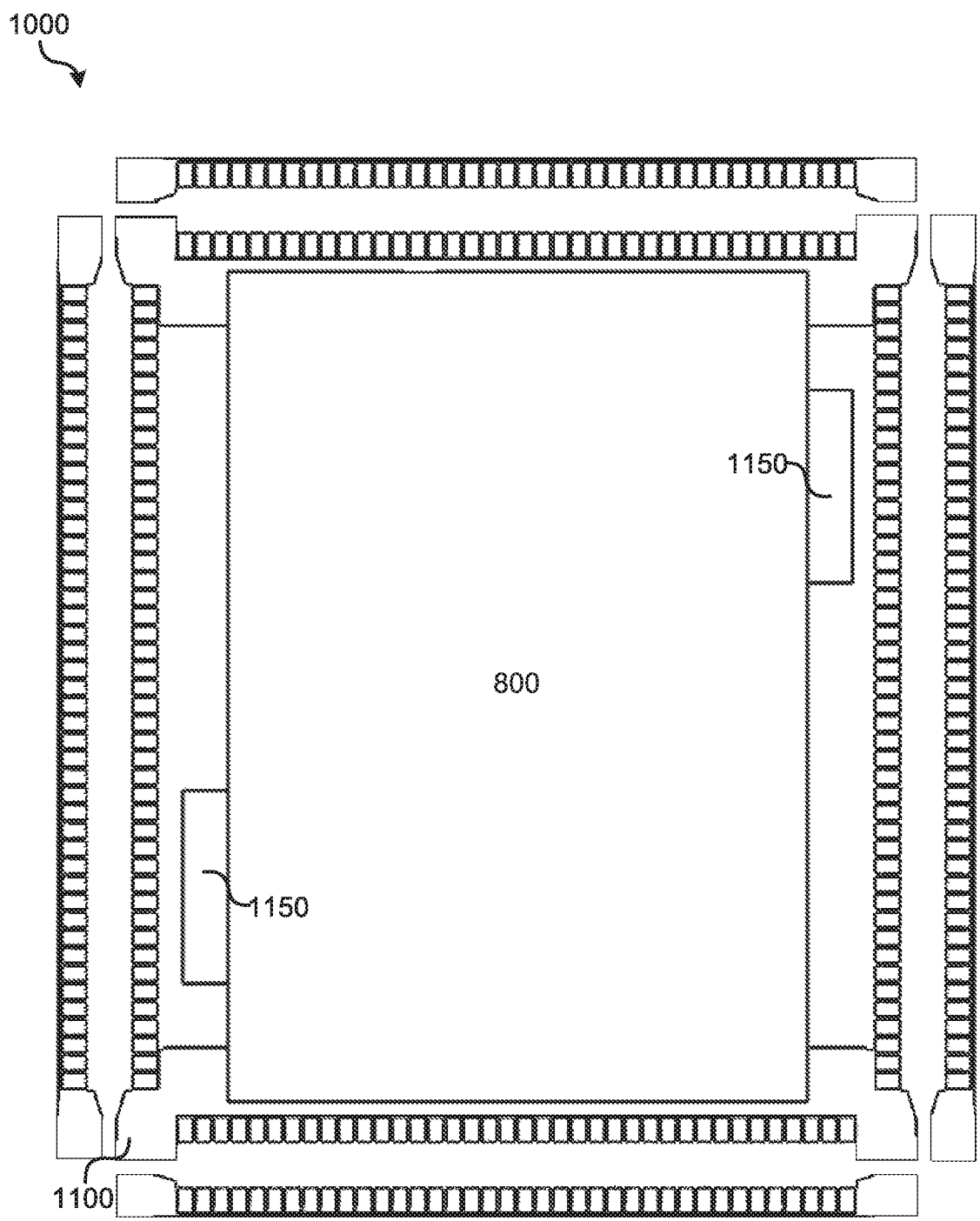
FIG. 6A illustrates an actuator with a moving frame, and an image sensor mounted on the actuator, in accordance with an embodiment of the present disclosure.

FIG. 6A is a top view illustrating an image sensor 800 mounted on a MEMS actuator 1000 including moving frame 1100. FIG. 6B illustrates a package housing 900 for covering the image sensor 800 on MEMS actuator 1000. FIGS. 6C-6E illustrate cross-sections of an assembled actuator optoelectronic package including the components of FIGS. 6A-6B. As shown, package housing 900 includes shock stops 910 and 920 that reduce the gap between component 1150 of moving frame 1100 and the back of package housing 900. Stops 910 and 920 may prevent the moving frame 1100 from moving excessively out of plane during a mechanical shock event, which may deform any motion control beams (e.g., cantilevers) of the actuator. In embodiments, the shock stops may be made of a suitable plastic.

Figure 7:
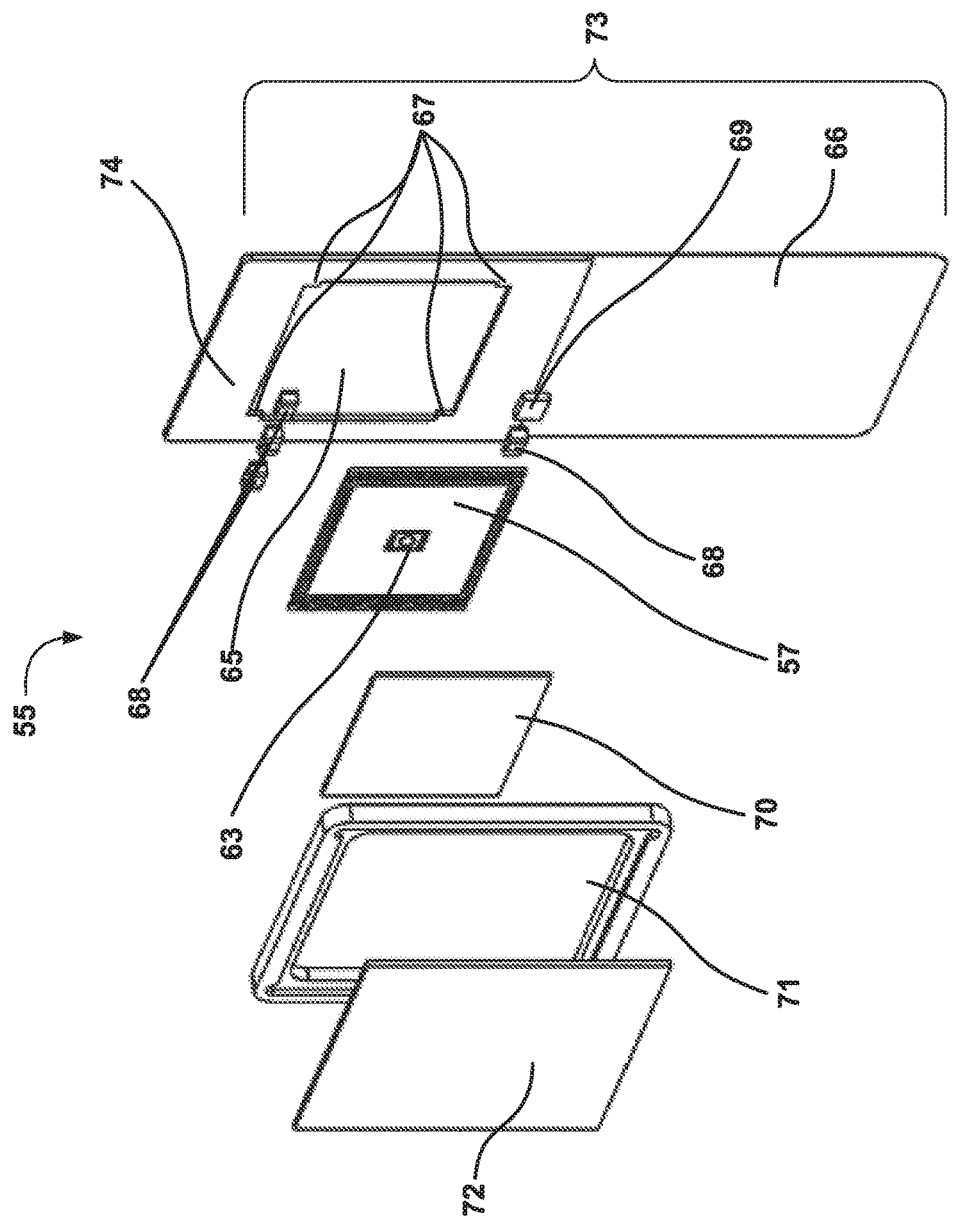
FIG. 7 is an exploded perspective view of an example image sensor package utilized in accordance with various embodiments of the disclosed technology.

FIG. 7 is an exploded perspective view illustrating an assembled moving image sensor package 55 that may use the mechanical shock reduction features described herein in accordance with one embodiment. In embodiments, moving image sensor package 55 may be a component of a miniature camera (e.g., a miniature camera for a mobile device). Moving image sensor package 55 can include, but is not limited to the following components: a substrate 73; a plurality of capacitors and/or other passive electrical components 68; a MEMS actuator driver 69; a MEMS actuator 57; an image sensor 70; an image sensor cap 71; and an infrared (IR) cut filter 72. Substrate 73 can include a rigid circuit board 74 with a recess 65 and in-plane movement limiting features 67, and a flexible circuit board acting as a back plate 66. The rigid circuit board 74 may be constructed out of ceramic or composite materials such as those used in the manufacture of plain circuit boards (PCB), or some other appropriate material(s). Moving image sensor package 55 may include one or more drivers 69.

Since the thermal conduction of air is roughly inversely proportional to the gap, and the image sensor 70 can dissipate a substantial amount of power between 100 mW and 1 W, the gaps between the image sensor 70, the stationary portions of the MEMS actuator 57, the moving portions of the MEMS actuator 57, and the back plate 66 are maintained at less than approximately 50 micrometers. In one embodiment, the back plate 66 can be manufactured out of a material with good thermal conduction, such as copper, to further improve the heat sinking of the image sensor 70. In one embodiment, the back plate 66 has a thickness of approximately 50 to 100 micrometers, and the rigid circuit board 74 has a thickness of approximately 150 to 200 micrometers.

While various embodiments of the present invention have been described above, it should be understood that they have been presented by way of example only, and not of limitation. Likewise, the various diagrams may depict an example architectural or other configuration for the invention, which is done to aid in understanding the features and functionality that can be included in the invention. The invention is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the present invention. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the invention is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the invention, whether or not such embodiments are described and whether or not such features are presented as being a part of a described embodiment. Thus, the breadth and scope of the present invention should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A microelectromechanical systems (MEMS) actuator, comprising:
an outer frame coupled to an inner frame by a beam; the beam which couples the outer frame and the inner frame, comprising:
a center portion comprising a first end and second end;
a first hinge directly coupled to the first end of the center portion; and
a second hinge directly coupled to the second end of the center portion,
wherein the first hinge and the second hinge are thinner than the center portion; and
a silicon caging structure at least partially surrounding, in parallel, at least one of the first hinge and the second hinge directly, wherein the silicon caging structure limits a maximum displacement of the beam in a direction perpendicular to a longitudinal axis of the beam, wherein the beam is a motion control flexure, and wherein the center portion is tapered along its length such that it is widest at its center and narrowest at its ends.

2. The MEMS actuator of claim 1, wherein the beam is a conductive cantilever, and wherein the center portion is curved and comprises a point of inflection.

3. The MEMS actuator of claim 1, wherein each of the first hinge and second hinge is tapered along its length such that is narrowest at its center and widest at its ends.

4. The MEMS actuator of claim 1, wherein the beam is between 1 and 7 millimeters long and between 10 and 70 micrometers wide, and wherein the beam is rigid in a direction along its length and flexible in a direction perpendicular to its length.

5. A microelectromechanical systems (MEMS) device, comprising:
a beam that is rigid in a direction along its length and flexible in a direction perpendicular to its length, comprising:
a center portion comprising a first end and second end;
a first hinge directly coupled to the first end of the center portion; and
a second hinge parallel to the first hinge and directly coupled to the second end of the center portion,
wherein the first hinge and the second hinge are thinner than the center portion; and
a silicon caging structure at least partially surrounding, in parallel, at least one of the first hinge and the second hinge directly, wherein the silicon caging structure limits a maximum displacement of beam in a direction perpendicular to a longitudinal axis of the beam, wherein the silicon caging structure comprises a protrusion extending parallel to and along the length of the first hinge or the second hinge, wherein the protrusion limits the maximum displacement of the beam in a direction perpendicular to its length.

6. The MEMS device of claim 5, further comprising:
a moving frame, wherein the silicon caging structure is part of the moving frame, and wherein at least one of the first hinge and the second hinge is coupled to the moving frame.

7. The MEMS device claim 5, wherein each of the first hinge and second hinge is tapered along its length such that is narrowest at its center and widest at its ends.

8. The MEMS device of claim 7, wherein the center portion is tapered along its length such that it is widest at its center and narrowest at its ends.

9. The MEMS device of claim 5, wherein the MEMS device is an actuator, wherein the beam is a motion control flexure of the actuator, and wherein at least one of the first hinge and the second hinge is coupled to a frame of the actuator.

10. The MEMS device of claim 9, wherein the first hinge is coupled to a fixed frame of the actuator, and wherein the second hinge is coupled to a moving frame of the actuator.

11. The MEMS device of claim 5, wherein the center portion is between 1 and 4 mm long and between 10 and 70 μm wide, and wherein each of the first and second hinges is between 0.05 and 0.3 mm long and between 1 and 10 μm wide.

12. The MEMS device of claim 5, wherein the beam is a conductive cantilever, wherein the center portion is curved and comprises a point of inflection.

13. The MEMS device of claim 12, wherein the length of the cantilever is between 4.5 and 7 millimeters, and wherein the center portion is between 0.012 and 0.030 millimeters wide.

14. The MEMS device of claim 12, wherein each of the first and second hinges is coupled to the center portion by a respective forked junction in a direction perpendicular to the length of the cantilever, wherein the forked junction comprises a plurality of parallel beams.

15. The MEMS device of claim 14, wherein the silicon caging structure comprises: a protrusion extending parallel to and along the length of the first hinge or the second hinge, wherein the protrusion limits the maximum displacement of the cantilever in a direction perpendicular to its length, wherein the cantilever reaches its maximum perpendicular displacement when the protrusion contacts one of the forked junctions.

\* \* \* \* \*